United States Patent
Yoshida et al.

(10) Patent No.: US 8,610,446 B2
(45) Date of Patent: Dec. 17, 2013

(54) TESTING DEVICE AND TESTING METHOD

(75) Inventors: Atsushi Yoshida, Matsumoto (JP); Hiroyuki Toya, Azumino (JP); Toru Nishizawa, Omachi (JP); Seizo Uchiyama, Nagano (JP)

(73) Assignee: Fuji Electric Co., Ltd., Kawasaki-shi (JP)

( * ) Notice: Subject to any disclaimer, the term of this patent is extended or adjusted under 35 U.S.C. 154(b) by 249 days.

(21) Appl. No.: 13/067,421

(22) Filed: Jun. 1, 2011

(65) Prior Publication Data
US 2011/0309850 A1 Dec. 22, 2011

(30) Foreign Application Priority Data
Jun. 2, 2010 (JP) ................................ 2010-126680

(51) Int. Cl.
*G01R 31/28* (2006.01)

(52) U.S. Cl.
USPC .................. 324/750.14; 324/76.11; 324/464; 324/750.01

(58) Field of Classification Search
USPC ...................... 324/76.11, 464, 750.01–750.19
See application file for complete search history.

(56) References Cited

U.S. PATENT DOCUMENTS

| | | | |
|---|---|---|---|
| 4,583,040 A * | 4/1986 | Hata et al. | 324/558 |
| 4,970,461 A * | 11/1990 | LePage | 324/754.24 |
| 5,652,381 A * | 7/1997 | Fuchs | 73/114.62 |
| 6,878,967 B2 * | 4/2005 | Sung | 257/72 |
| 2008/0237185 A1 * | 10/2008 | Ui et al. | 216/67 |
| 2011/0267083 A1 * | 11/2011 | Tsuji | 324/750.03 |
| 2012/0037314 A1 * | 2/2012 | Endoh et al. | 156/345.34 |

FOREIGN PATENT DOCUMENTS

| | | |
|---|---|---|
| JP | H03-037581 A | 2/1991 |
| JP | H06-120315 | 4/1994 |
| JP | H11-271387 | 10/1999 |
| JP | 2001-194409 A | 7/2001 |
| JP | 2001194409 A * | 7/2001 |
| JP | 2002-158267 | 5/2002 |
| JP | 2002-313858 A | 10/2002 |
| JP | 2003-100819 | 4/2003 |
| JP | 2004-061488 A | 2/2004 |
| JP | 2004061488 A * | 2/2004 |
| JP | 2004-177201 A | 6/2004 |

(Continued)

OTHER PUBLICATIONS

Japan Patent Office, "Office Action for JP 2010-126680", Feb. 19, 2013.

(Continued)

*Primary Examiner* — Jermele M Hollington
*Assistant Examiner* — Adam Clarke
(74) *Attorney, Agent, or Firm* — Manabu Kanesaka

(57) ABSTRACT

A testing device includes a pressure vessel, a mounting stand disposed in an internal space of the pressure vessel, on which a device to be tested is mounted, test electrodes, disposed in the internal space of the pressure vessel, that supply a test voltage to the device to be tested mounted on the mounting stand, and a pressurization unit that raises the pressure of the internal space of the pressure vessel. The test voltage is supplied from the test electrodes to the device to be tested mounted on the mounting stand, and testing of the device to be tested is carried out, in a condition that the pressure of the internal space of the pressure vessel is raised by the pressurization unit.

13 Claims, 18 Drawing Sheets

(56) References Cited

FOREIGN PATENT DOCUMENTS

| JP | 2007-309806 | A |   | 11/2007 |
|----|-------------|---|---|---------|
| JP | 2007309806  | A | * | 11/2007 |
| JP | 2008-107014 | A |   | 5/2008  |
| JP | 2010-010306 |   |   | 1/2010  |
| JP | 2011-141169 |   |   | 7/2011  |

OTHER PUBLICATIONS

Japan Patent Office, "Office Action for JP 2010-126680", Jun. 11, 2013.

* cited by examiner

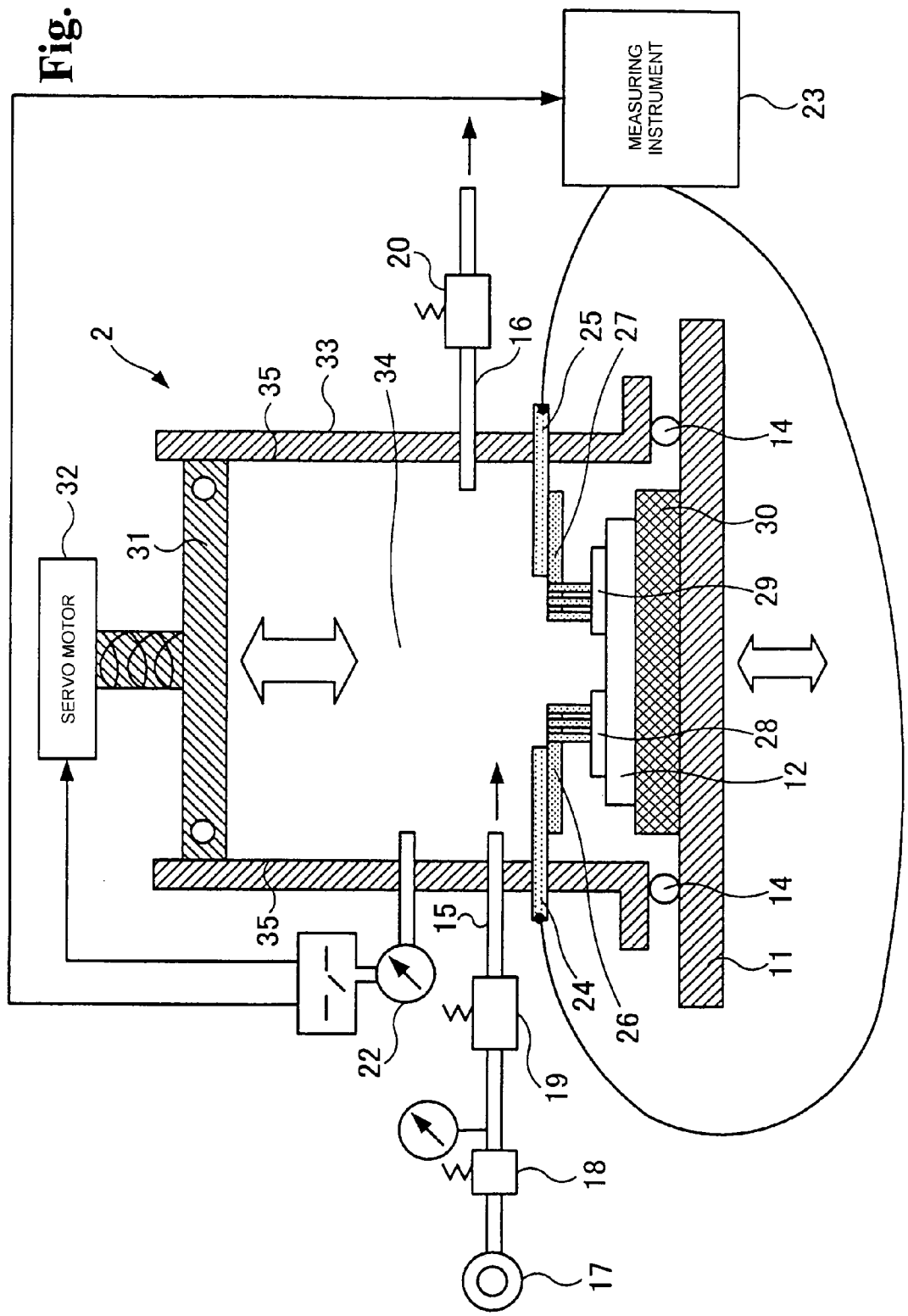

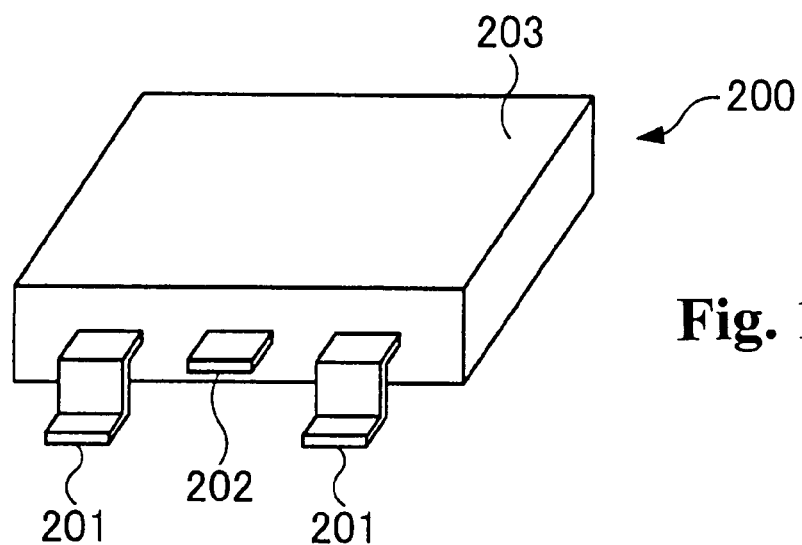
Fig. 17
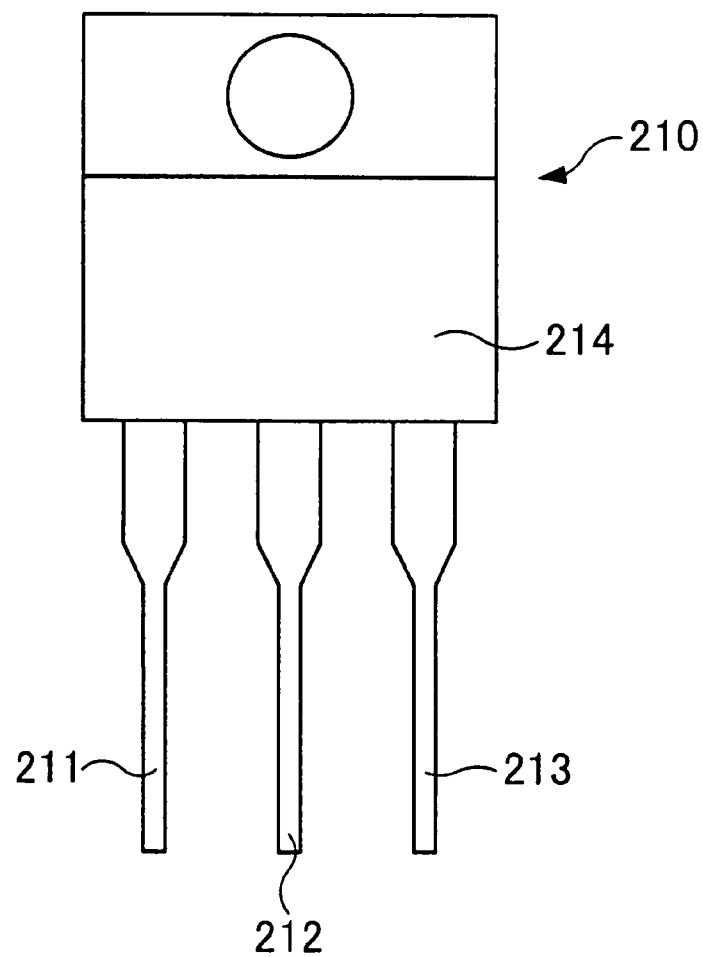

TESTING DEVICE AND TESTING METHOD

BACKGROUND OF THE INVENTION AND RELATED ART STATEMENT

The present invention relates to a testing device and testing method for carrying out a high voltage testing of a device to be tested.

A testing method exists whereby a high voltage test is supplied to a device to be tested, and a high voltage testing of the device is carried out. With this kind of testing method, a dielectric breakdown and a discharge occurs between electrodes of the device to be tested, or between electrodes of the device to be tested and a testing device, and the like. There is a possibility of the device to be tested or testing device being damaged, and a possibility of the testing of the device to be tested not being carried out correctly.

For this reason, a technology exists whereby the device to be tested is disposed in an environment of a gas with a high insulation property, for example, sulfur hexafluoride gas ($SF_6$), and high voltage testing is performed after ensuring the dielectric strength of the testing environment.

However, a gas with a high insulation property, typified by sulfur hexafluoride gas, has a high global warming potential (GWP), and the burden on the global environment is large. For example, the global warming potential of sulfur hexafluoride gas is "23,900".

For this reason, consideration is given to suppressing discharge with a method other than the method using a gas with a high insulation performance. For example, there is a technology whereby an insulation shield is disposed in a discharge path. For example, a high voltage testing device exists that has an insulation shield that comes into contact with the surface of a seal between first and second leads of a subject of measurement (for example, refer to JP-A-11-271387). Also, a semiconductor wafer measuring device exists wherein an insulation member is interposed between the leading ends of a pair of probes that comes into contact with a wafer, in such away as to come into contact with the wafer (for example, refer to JP-A-2010-10306).

Also, as another method, there is a technology whereby testing is carried out in a condition in which a device to be tested is immersed in an insulating solution. For example, a technology exists whereby withstand voltage measurement is performed with a semiconductor device immersed in a fluorocarbon solution with an insulation property (for example, refer to JP-A-6-120315). Also, a technology exists whereby the withstand voltage of a semiconductor substrate is inspected by covering at least the surface of the semiconductor substrate with an insulating solution, and applying a voltage between at least two places on the semiconductor substrate (for example, refer to JP-A-2003-100819).

However, with the method whereby an insulation shield is disposed in the discharge path, a structure wherein the insulation shield is disposed in a predetermined position is necessary, meaning that there is a possibility of the testing device becoming complicated.

Also, with the method whereby testing is carried out in a condition in which the device to be tested is immersed in an insulating solution, since the insulating solution is used, there is a possibility that the equipment for the testing becomes complicated. For example, when a solution with a low boiling point, such as fluorocarbon, is used as the insulating solution, an equipment for preventing the insulating solution from evaporating during the testing, or equipment for the evacuation or collection of gas when drying, is necessary. Also, even when a solution that does not have a low boiling point is used as the insulating solution, equipment for cleaning is necessary.

SUMMARY OF THE INVENTION

Bearing in mind these kinds of problems, the invention has an object of providing a testing device and a testing method that realizes a high voltage testing while reducing the burden on the global environment and without complicating a testing device or equipment for the testing.

In order to achieve the object, the following kinds of testing device and testing method are provided.

The testing device includes a pressure vessel; a mounting stand disposed in an internal space of the pressure vessel, on which a device to be tested is mounted; test electrodes disposed in the internal space of the pressure vessel, that supply a test voltage to the device to be tested mounted on the mounting stand; and a pressurization unit that raises the atmospheric pressure of the internal space of the pressure vessel, wherein the test voltage is supplied from the test electrodes to the device to be tested mounted on the mounting stand, and testing of the device to be tested is carried out in a condition in which the atmospheric pressure of the internal space of the pressure vessel is raised by the pressurization unit.

Also, the testing method includes steps of mounting a device to be tested on a mounting stand disposed in an internal space of a pressure vessel, raising the atmospheric pressure of the internal space of the pressure vessel, and supplying a test voltage from test electrodes disposed in the internal space to the device to be tested mounted on the mounting stand, and carrying out testing of the device to be tested, in a condition in which the atmospheric pressure of the internal space of the pressure vessel is raised.

According to the testing device and testing method of the invention, it is possible to realize a high voltage testing while reducing the burden on the global environment, and without complicating a testing device or equipment for the testing.

BRIEF DESCRIPTION OF THE DRAWINGS

FIG. 4 is a diagram showing one example of a testing device according to a second embodiment;

FIG. 17 is a diagram showing another example of a device to be tested according to the fifth embodiment.

DETAILED DESCRIPTION OF THE INVENTION

Figure 1:
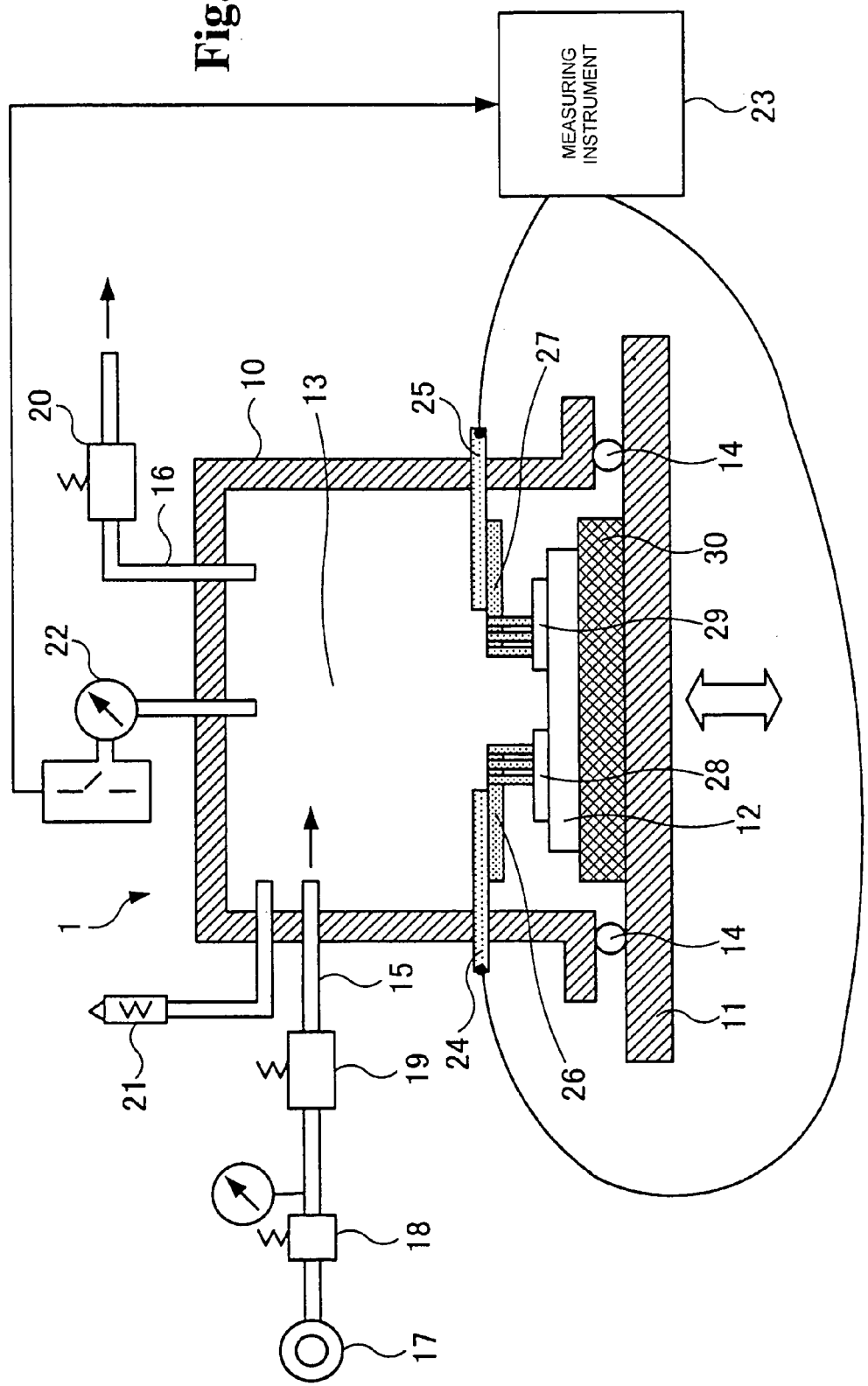
FIG. 1 is a diagram showing one example of a testing device according to a first embodiment.

Hereafter, a description will be given, referring to the drawings, of embodiments.

First Embodiment

FIG. 1 is a diagram showing one example of a testing device according to a first embodiment.

A testing device 1 has a pressure vessel 10, a bottom plate 11, and a measuring instrument 23. The pressure vessel 10 has an internal space 13 in which testing of a device to be tested (DUT) 12 is carried out, and can withstand pressure until the pressure of the internal space 13 reaches a specified pressure. The pressure vessel 10 may also be called, for example, a chamber. Herein, an example is given of a case in which the device to be tested 12 is a semiconductor device including electrodes 28 and 29. Also, the device to be tested 12 may be any one of a semiconductor wafer, a semiconductor chip, a semiconductor package, or a semiconductor module. The testing device 1 may be a wafer prober, a handler, or the like, as appropriate in accordance with the devices 12 to be tested.

The bottom plate 11 is disposed in such a way as to cover the internal space 13 of the pressure vessel 10, and is brought into close contact with the pressure vessel 10 via O-rings 14. By the pressure vessel 10 and bottom plate 11 being brought into close contact, the air tightness of the internal space 13 of the pressure vessel 10 is ensured. Furthermore, the bottom plate 11 can descend and rise, and by descending, is detached from the pressure vessel 10. At this time, the internal space 13 is open to the atmosphere.

Firstly, a detailed description will be given of the pressure vessel 10. A pipe 15 for supplying gas to the internal space 13 and a pipe 16 for evacuating the gas from the internal space 13 are provided in the pressure vessel 10. The pipe 15 is connected to a gas supplying source 17. The gas supplying source 17 supplies a high pressure gas (for example, 0.12 MPa or more) such as a compressed gas compressed inside a high pressure cylinder or by a compressor, or a liquid gas (for example, liquid nitrogen).

Also, the gas supplied by the gas supplying source 17 is a gas with a low global warming potential. Specifically, it may be nitrogen, air, carbon dioxide, argon, or oxygen, or a mixed gas including one or a plurality of these gasses. Also, when a high insulation property is required for the gas, a gas which is a mixture of one or more of these gases and a gas which, although having a high GWP, has an excellent insulation property, such as sulfur hexafluoride, is supplied.

Furthermore, a regulator 18 and a supply solenoid valve 19 are provided in the pipe 15 between the gas supplying source 17 and internal space 13. The regulator 18 adjusts the pressure of the high pressure gas supplied from the gas supplying source 17 to a predetermined value. The supply solenoid valve 19, by being opened and closed, controls the supply or stopping of the gas to the internal space 13 of the high pressure gas whose pressure is adjusted by the regulator 18.

An evacuation solenoid valve 20 is provided in the pipe 16. The evacuation solenoid valve 20, by being opened and closed, controls the evacuation or stopping of the evacuation of the gas in the internal space 13. Also, the pipe 16 may be connected to a vacuum pump (not shown).

Furthermore, a relief valve 21 is provided in the pressure vessel 10. When the internal space 13 reaches a specified atmospheric pressure or more, the relief valve 21 carries out an evacuation of the gas in the internal space 13, keeping the internal space 13 at the specified atmospheric pressure. When adjusting the atmospheric pressure of the internal space 13 using the relief valve 21, it is not necessary to provide the regulator 18.

Furthermore, a pressure gauge 22 is provided in the pressure vessel 10. The pressure gauge 22 measures the atmospheric pressure of the internal space 13. Also, the pressure gauge 22 includes a contact switch and, when detecting that the atmospheric pressure of the internal space 13 has reached a predetermined value, it transmits a detection signal to the measuring instrument 23.

Furthermore, a pair of test terminals 24 and 25 is provided in the pressure vessel 10. In this working example, there are two test terminals 24 and 25, in order to simplify the description, but the invention, not being limited to two test terminals, also includes a case of providing three or more test terminals in accordance with measuring specifications. Each test terminal 24 and 25 extends from the exterior of the pressure vessel 10 to the internal space 13. The portion of each test terminal 24 or 25 positioned on the exterior of the pressure vessel 10 is electrically connected to the measuring instrument 23. A test voltage is supplied from the measuring instrument 23 to each of the test terminals 24 and 25.

Furthermore, a pair of test electrodes 26 and 27 is provided in the internal space 13 of the pressure vessel 10. The test electrodes 26 and 27 may also be called test contactors. The test electrode 26 is connected to the test terminal 24, receives the test voltage from the test terminal 24, and supplies the received test voltage to the electrode 28 of the device to be tested 12 disposed in the internal space 13.

The test electrode 27 is connected to the test terminal 25, receives the test voltage from the test terminal 25, and supplies the received test voltage to the electrode 29 of the device to be tested 12 disposed in the internal space 13. The testing of the device to be tested 12 is carried out by the test voltage being supplied from the test electrodes 26 and 27 to the electrodes 28 and 29 of the device to be tested 12.

Next, a description will be given of the bottom plate 11. A mounting stand 30 on which the device to be tested 12 is mounted is provided on surface of the bottom plate 11, facing the internal space 13 of the pressure vessel 10. When the bottom plate 11 is in close contact with the pressure vessel 10, the device to be tested 12 mounted on the mounting stand 30 is positioned in the internal space 13 of the pressure vessel 10, and the electrodes 28 and 29 of the device to be tested 12 come into contact with the test electrodes 26 and 27 respectively.

Also, when the bottom plate 11 descends, becoming detached from the pressure vessel 10, the device to be tested 12 is carried outside the pressure vessel 10, and the electrodes

28 and 29 of the device to be tested 12 become detached from the test electrodes 26 and 27 respectively.

Next, a description will be given of the measuring instrument 23. The measuring instrument 23 includes a test circuit of a high voltage power source, measuring circuit, and the like, and carries out the testing of the device to be tested 12 by supplying the test voltage to the test terminals 24 and 25. The supply of the test voltage, that is, the start of the testing, is carried out in response to a detection signal transmitted from the pressure gauge 22. Also, it is possible to start the supply of the test voltage manually.

Next, a description will be given of a method of carrying out the testing of the device to be tested 12 using the testing device 1.

Figure 2:
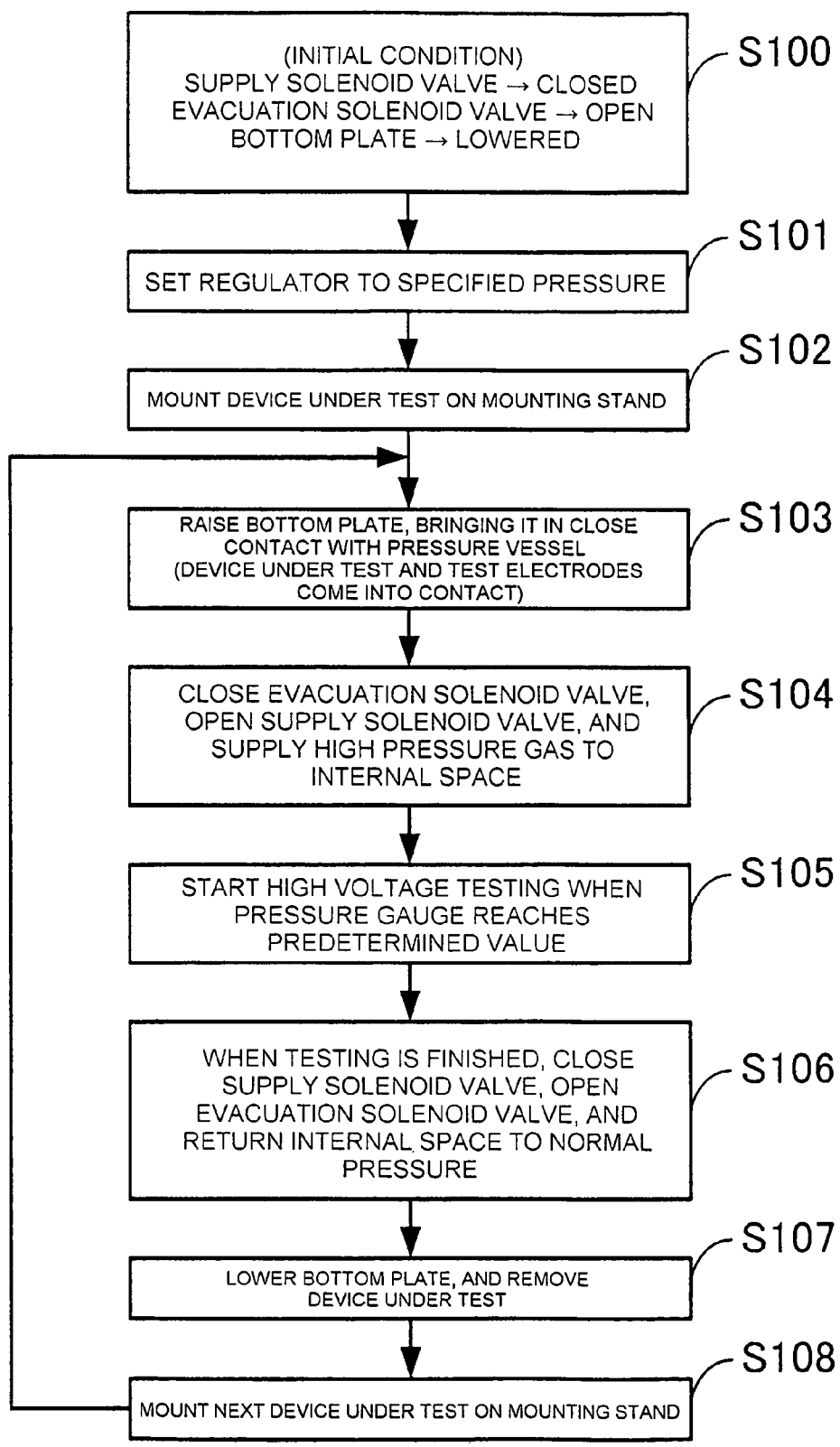
FIG. 2 is a flow chart showing one example of a testing method according to the first embodiment.

FIG. 2 is a flow chart showing one example of a testing method according to the first embodiment.

Step S100: as an initial condition, the supply solenoid valve 19 is closed, and the evacuation solenoid valve 20 is opened. Furthermore, the bottom plate 11 is lowered, detaching the bottom plate 11 and pressure vessel 10 from each other.

Step S101: the regulator 18 is adjusted to the specified pressure setting.

Step S102: the device to be tested 12 is mounted on the mounting stand 30. This operation may be carried out manually, or may be carried out automatically using a conveyor.

Step S103: the bottom plate 11 is raised, and brought into close contact with the pressure vessel 10. Herein, the positions of the test electrodes 26 and 27 are adjusted in advance, or the positions of the test electrodes 26 and 27 are adjusted to specified positions on the device to be tested 12 by way of a pattern recognition using an image sensor, or the like, so that the electrodes 28 and 29 of the device to be tested 12 and the test electrodes 26 and 27 come into contact when the bottom plate 11 and pressure vessel 10 are brought into close contact.

Step S104: the evacuation solenoid valve 20 is closed, and the supply solenoid valve 19 is opened. Because of this, a high pressure gas whose pressure is adjusted by the regulator 18 is supplied to the internal space 13, and the atmospheric pressure of the internal space 13 rises.

Step S105: when the pressure gauge 22 reaches a predetermined value, the pressure gauge 22 transmits a detection signal to the measuring instrument 23, and the measuring instrument 23 starts the testing of the device to be tested 12 by supplying the test voltage to the test terminals 24 and 25 in response to the received detection signal. By carrying out the start of the testing automatically in this way, it is possible to reduce personnel costs. Also, the supply solenoid valve 19 may be closed at this time.

In this way, the testing of the device 12 is carried out in a condition in which the atmospheric pressure of the internal space 13 of the pressure vessel 10, which is the testing environment, is raised.

Step S106: when the testing is finished, the supply solenoid valve 19 is closed, the evacuation solenoid valve 20 is opened, and the internal space 13 of the pressure vessel 10 is returned to a normal pressure.

Step S107: the bottom plate 11 is lowered, and the device 12 to be tested is removed from the internal space 13. A process of categorizing the removed device 12 to be tested as good or defective, or the like, is carried out in accordance with the testing result.

Step S108: the next device 12 to be tested is mounted on the mounting stand 30, and the process is advanced to step S103.

The testing of the device 12 to be tested is carried out in accordance with the heretofore described steps. When the removal of atmospheric components in the internal space 13 is necessary, or when it is necessary to increase the concentration of the gas supplied, the pipe 16 is connected to the vacuum pump, and the vacuum pump is activated between step S103 and step S104, discharging air remaining in the internal space 13.

Also, when the humidity of the internal space 13 of the pressure vessel 10 is high, it may happen that the dielectric strength of the testing environment decreases due to absorption of moisture by the device 12 to be tested or test electrodes 26 and 27, or the moisture contained in the environmental gas itself. For this reason, in order not to reduce the dielectric strength, it is effective to keep the humidity of the internal space 13 at 80% RH or less.

As a way of realizing this, for example, when the specified value of the gas pressure in the testing environment is, for example, 0.2 MPa, there is a method whereby the humidity of the actual gas supplied to the internal space 13 of the pressure vessel 10 is kept at 60% RH or less, and there is a method whereby, as well as the humidity of the internal space 13 (at atmospheric pressure) before the supply of gas being kept at 80% RH or less, the humidity of the supplied gas is also kept at 80% RH or less.

In the former case, even supposing that the humidity of the internal space 13 before supplying the gas is 100% RH, the overall humidity becomes 80% RH or less by supplying the same volume of gas with a humidity of 60% RH or less. For example, if a nitrogen gas created from liquid nitrogen, or a gas enclosed in a commercially available high pressure cylinder is used to supply the gas supplying source 17, the humidity of these gases is 1% RH or less, which is extremely low in comparison with the upper limit of the humidity required for the testing. For this reason, when the specified atmospheric pressure of the internal space 13 is comparatively high, it is easily possible to realize a low humidity environment.

In the way heretofore described, in the first embodiment, the test voltage is supplied from the test electrodes 26 and 27 to the device 12 to be tested, and the testing of the device 12 to be tested is carried out in a condition in which the atmospheric pressure of the internal space 13 of the pressure vessel 10, which is the testing environment, is raised. According to this configuration, it is possible to reduce the possibility of dielectric breakdown occurring in the environment of the internal space 13 during testing, and discharge occurring between the electrodes 28 and 29 of the device 12 to be tested, and between the electrodes 28, 29 and the testing device 1, or the like.

That is, when the pressure of the internal space 13 of the pressure vessel 10 rises, the dielectric strength of the environment of the internal space 13 rises. This is based on Paschen's Law. Paschen's Law is a law indicating that the pressure at which a spark discharge occurs between parallel electrodes is a function of the product of the atmospheric pressure and the gap between the electrodes.

When the atmospheric pressure is taken to be "p", and the gap between the electrodes is "d", although the relationship between the discharge voltage and "p*d" varies according to the kind of atmospheric pressure, in most cases the minimum value of the discharge voltage is seen in a range in which "p*d" (units: atmospheric pressure*mm) is from $10^{-2}$ to $10^{-1}$.

A spark discharge occurs owing to electrons accelerated in an electrical field colliding with gas molecules causing the gas to be ionized. For this reason, when the gas decreases beyond a certain limit, collision becomes difficult to occur and there is little ionized gas, so that it is difficult for a spark discharge to occur. Also, conversely, when the gas increases beyond the certain limit, it is difficult for the electrons to be accelerated sufficiently to collide, and there is little ionized gas; in other words, it is difficult for a spark discharge to occur. That is, at this limit, it is easiest for a spark discharge to occur, and the discharge voltage is at the minimum value.

According to Paschen's Law, in a range in which "p*d" is greater than the value at which the discharge voltage reaches the minimum value, the discharge voltage also increases as "p*d" increases. That is, Paschen's Law indicates that when raising the pressure of the gas under a condition in which the gap between the electrodes is constant, the discharge voltage increases, and it is possible to increase the dielectric strength.

Figure 3A:
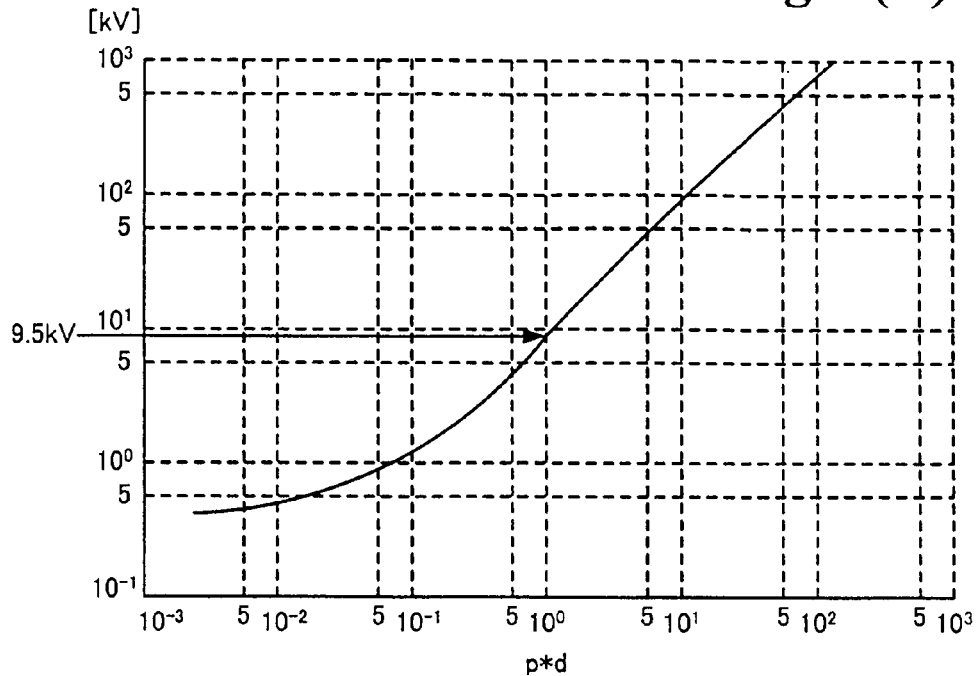
FIGS. 3A and 3B are diagrams showing examples of a Paschen curve.
Figure 3B:
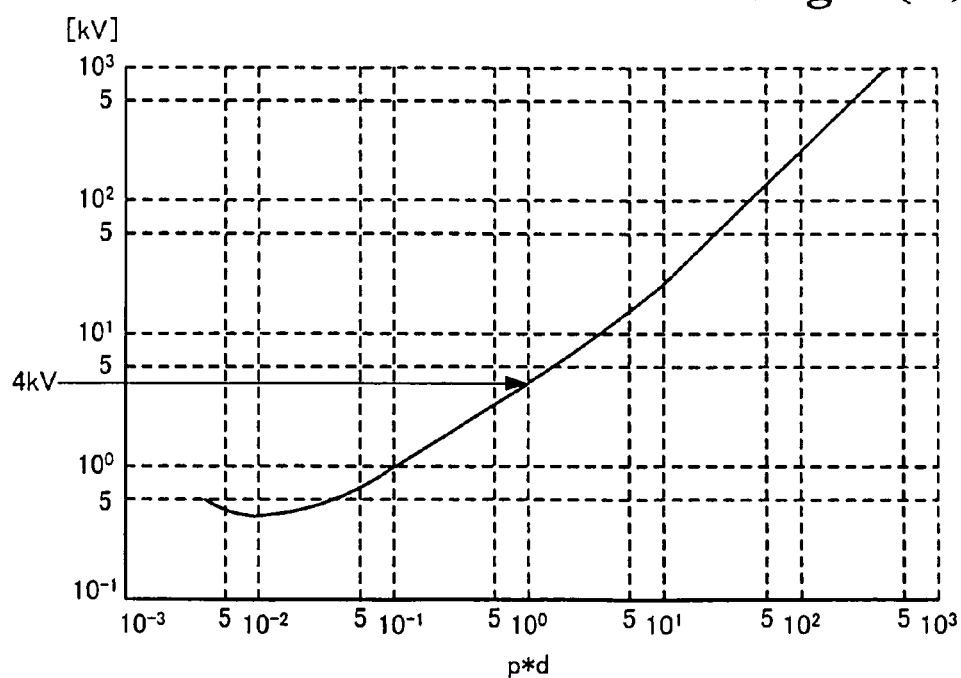

FIGS. 3A and 3B are diagrams showing examples of a Paschen curve. FIG. 3A is a diagram showing a Paschen curve for a sulfur hexafluoride gas, and FIG. 3B is a diagram showing a Paschen curve for nitrogen. Herein, the horizontal axis shows "p*d", and the vertical axis shows a discharge voltage "kV". As shown in FIGS. 3A and 3B, when "p*d" is greater than the range of $10^{-2}$ to $10^{-1}$, the discharge voltage also increases as "p*d" increases.

As the dielectric strength of the environment of the internal space 13 increases when the pressure of the internal space 13 of the pressure vessel 10 rises in this way, according to the first embodiment, as heretofore described, it is possible to reduce the possibility of dielectric breakdown occurring in the environment of the internal space 13 during testing, and discharge occurs.

For this reason, it is possible to perform the high voltage testing without using a gas with a high global warming potential and a high insulation property, typified by sulfur hexafluoride gas, in the gas supplied to the internal space 13 of the pressure vessel 10. Therefore, it is possible to reduce the burden on the global environment.

That is, for example, when the gas supplied to the internal space 13 of the pressure vessel 10 is nitrogen, the insulation property of nitrogen is lower than that of sulfur hexafluoride gas. For example, as shown by the Paschen curve of FIG. 3A, when "p" is one atmosphere and "d" is 1 mm, that is, when "p*d" is 10°, the discharge voltage of the sulfur hexafluoride gas is 9.5 kV. As opposed to this, as shown by the Paschen curve of FIG. 3B, the discharge voltage of nitrogen is approximately 4 kV when "p*d" is 10°.

However, according to the first embodiment, even when using nitrogen in the gas supplied, it is possible to increase the dielectric strength of the environment of the internal space 13 by raising the atmospheric pressure of the internal space 13, and it is possible to perform the high voltage testing.

Also, a gas with a high insulation property is comparatively expensive. Therefore, by performing the high voltage testing without using a gas with a high insulation property, it is possible to considerably reduce the testing cost.

Furthermore, in the first embodiment, as it is possible to increase the dielectric strength of the environment of the internal space 13 simply by raising the atmospheric pressure of the internal space 13, it is possible to realize the high voltage testing without complicating the testing device or the equipment for the testing.

Next, a description will be given, as a second embodiment, of an embodiment using a pressurization unit other than that of the testing device 1 for raising the atmospheric pressure of the internal space 13 of the pressure vessel 10.

Second Embodiment

FIG. 4 is a diagram showing one example of a testing device according to the second embodiment.

A testing device 2 is such that the form of a pressure vessel 33 differs in comparison with that of the testing device 1, and furthermore, a piston 31 and a servomotor 32 are additionally provided. Also, although no relief valve is provided, one may be provided. Other configurations are the same as those of the testing device 1.

A pressure vessel 33 has an aperture at the top thereof. The piston 31 is disposed in such a way as to block the aperture of the pressure vessel 33. The servomotor 32 is provided on the piston 31. The piston 31 raises or lowers an internal space 34 of the pressure vessel 33 by being controlled by the servo motor 32.

At this time, the piston 31, while making close contact with an internal wall 35 of the pressure vessel 33, moves along the internal wall 35. That is, the pressure vessel 33 functions as a cylinder. The control of the piston 31 may be carried out manually, instead of the servo motor 32. In this case, a hand press or the like using the principle of, for example, a weight or lever is used.

By the piston 31 descending, gas in the internal space 34 of the pressure vessel 33 is compressed, and the atmospheric pressure of the internal space 34 rises. By the piston 31 rising, the atmospheric pressure of the internal space 34 of the pressure vessel 33 drops reaching a normal pressure.

Also, the pressure of a high pressure gas supplied by a gas supplying source 17 may be lower than that in the case of the testing device 1, for example, it may be 0.1 MPa or more.

When the gas supplied to the internal space 34 is the air, there is no need to provide the gas supplying source 17 or a regulator 18, and it is sufficient that a structure is such that the air can be taken in from a pipe 15. Also, in this case, there is no need to provide the pipe 15 and a pipe 16 separately, and the supply and evacuation of gas may be carried out using the same pipe.

Next, a description will be given of methods of carrying out a testing of a device to be tested 12 using the testing device 2. Firstly, a description will be given of, as an example, a case in which the gas supplied to the internal space 34 of the pressure vessel 33 is the air, no gas supplying source 17 or regulator 18 is provided in the testing device 2, and the air is taken in from the pipe 15.

Figure 5:
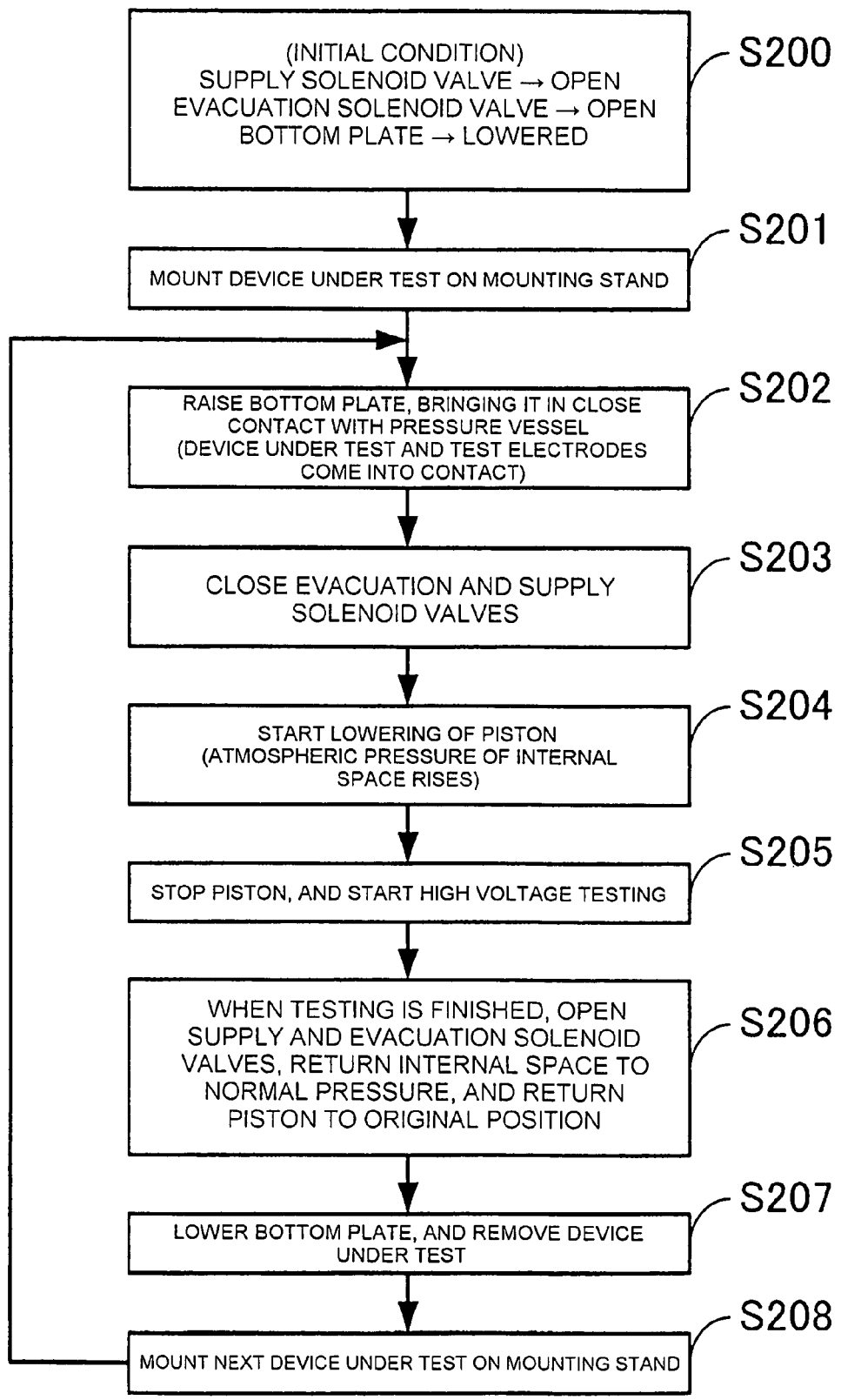
FIG. 5 is a flow chart showing one example of a testing method according to the second embodiment.

FIG. 5 is a flow chart showing one example of a testing method according to the second embodiment.

Step S200: as an initial condition, a supply solenoid valve 19 and an evacuation solenoid valve 20 are opened. Furthermore, a bottom plate 11 is lowered, detaching the bottom plate 11 and pressure vessel 33 from each other. Herein, whether the supply solenoid valve 19 and evacuation solenoid valve 20 are opened or closed is optional, but the lowering of the bottom plate 11 is carried out more smoothly when they are opened.

Step S201: the device to be tested 12 is mounted on a mounting stand 30. This operation may be carried out manually, or may be carried out automatically using a conveyor.

Step S202: the bottom plate 11 is raised, and brought into close contact with the pressure vessel 33. Herein, the positions of test electrodes 26 and 27 are adjusted in advance, so that electrodes 28 and 29 of the device to be tested 12 and the test electrodes 26 and 27 come into contact when the bottom plate 11 and pressure vessel 33 are brought into close contact.

Step S203: the evacuation solenoid valve 20 and supply solenoid valve 19 are closed.

Step S204: the piston 31 is lowered by the servo motor 32, raising the atmospheric pressure of the internal space 34 of the pressure vessel 33.

Step S205: when a pressure gauge 22 reaches a predetermined value, the pressure gauge 22 transmits a detection signal to a measuring instrument 23 and the servomotor 32. The servomotor 32, on receiving the detection signal, stops the lowering of the piston 31. The measuring instrument 23 starts the testing of the device to be tested 12 by supplying a test voltage to test terminals 24 and in response to the received detection signal. Also, a configuration may be adopted whereby, when the piston 31 has descended to a pre-confirmed position at which it is possible to ensure a specified atmospheric pressure, the lowering of the piston 31 is stopped, and the testing is started.

In this way, the testing of the device to be tested 12 is carried out in a condition in which the atmospheric pressure of the internal space 34 of the pressure vessel 33, which is the testing environment, is raised.

Step S206: when the testing is finished, the supply solenoid valve 19 and evacuation solenoid valve 20 are opened, the internal space 34 of the pressure vessel 33 is returned to a normal pressure, and the piston 31 is raised by the servo motor 32, being returned to the original position.

Although it is possible to return the internal space 34 to a normal pressure even when the piston 31 is raised with the supply solenoid valve 19 and evacuation solenoid valve 20 in a closed condition, the lowering of the bottom plate 11 in the next step S207 can be more smoothly carried out when the supply solenoid valve 19 and evacuation solenoid valve 20 are opened.

Step S207: the bottom plate 11 is lowered, and the device to be tested 12 is removed from the internal space 34. A process of categorizing the removed device to be tested 12 as good or defective, or the like, is carried out in accordance with the testing result.

Step S208: the next device to be tested 12 is mounted on the mounting stand 30, and the process is advanced to step S202.

The testing of the device to be tested 12 is carried out in accordance with the heretofore described steps.

Next, a description will be given of a testing method using the testing device 2 with a case in which a gas other than the air is used in the gas supplied to the internal space 34 of the pressure vessel 33 as an example. In the example, the gas supplying source 17 and regulator 18 are provided in the testing device 2.

Figure 6:
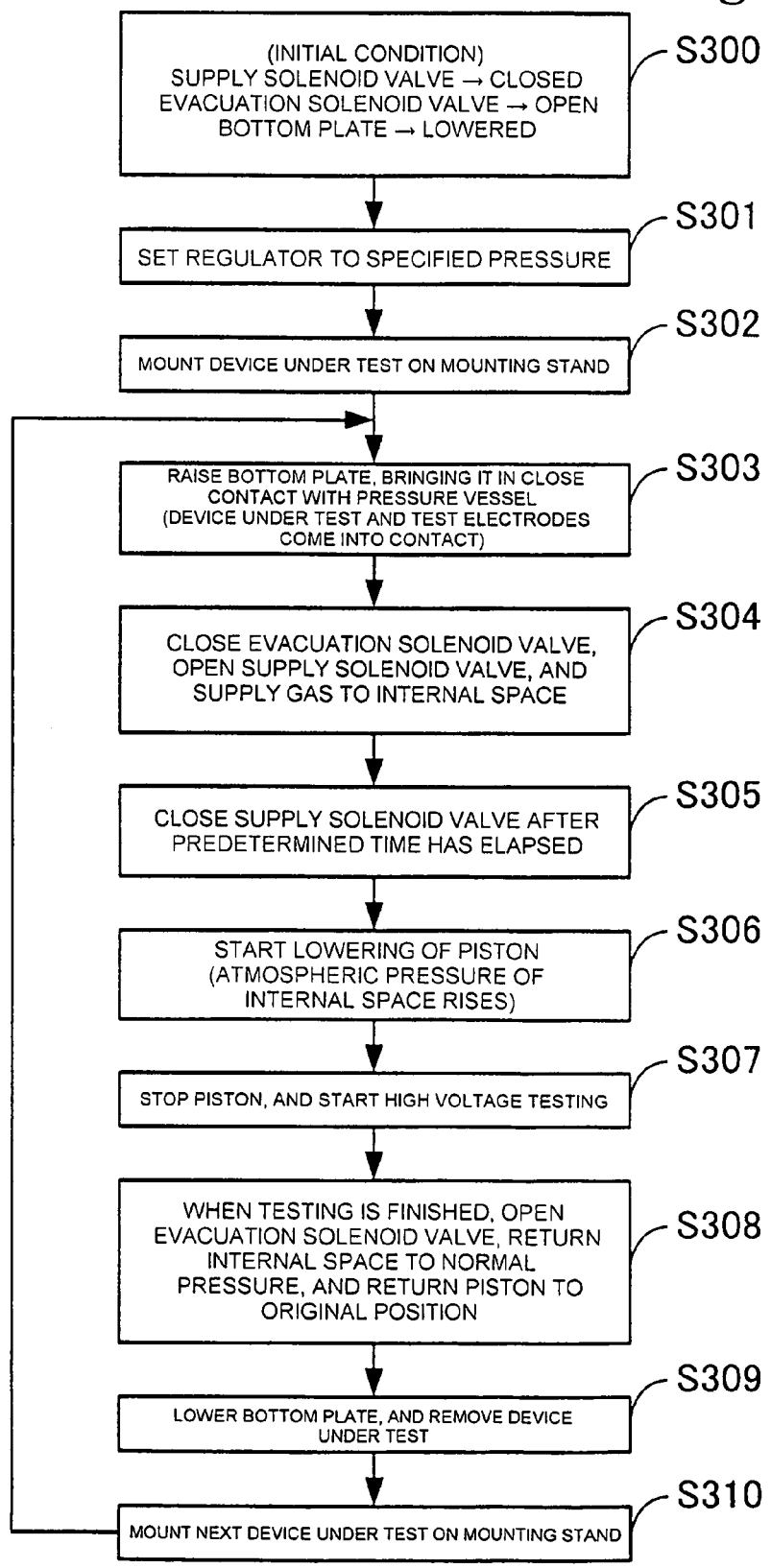
FIG. 6 is a flow chart showing another example of a testing method according to the second embodiment.

FIG. 6 is a flow chart showing another example of a testing method according to the second embodiment.

Step S300: as an initial condition, the supply solenoid valve 19 is closed, and the evacuation solenoid valve 20 is opened. Furthermore, the bottom plate 11 is lowered detaching the bottom plate 11 and pressure vessel 33 from each other.

Step S301: the regulator 18 is adjusted to the specified pressure setting.

Step S302: the device to be tested 12 is mounted on the mounting stand 30. This operation may be carried out manually, or may be carried out automatically using a conveyor.

Step S303: the bottom plate 11 is raised, and brought into close contact with the pressure vessel 33. Herein, the positions of the test electrodes 26 and 27 are adjusted in advance, so that the electrodes 28 and 29 of the device to be tested 12 and the test electrodes 26 and 27 come into contact when the bottom plate 11 and pressure vessel 33 are brought into close contact.

Step S304: the evacuation solenoid valve 20 is closed, and the supply solenoid valve 19 is opened. Because of this, a gas whose pressure is adjusted by the regulator is supplied to the internal space 34.

Step S305: after waiting until a predetermined time elapses so that the concentration of the gas supplied to the internal space 34 reaches a specified value, the supply solenoid valve 19 is closed.

Step S306: the piston 31 is lowered by the servo motor 32 raising the atmospheric pressure of the internal space 34 of the pressure vessel 33.

Step S307: when the pressure gauge 22 reaches a predetermined value, the pressure gauge 22 transmits a detection signal to the measuring instrument 23 and servo motor 32. The servo motor 32, on receiving the detection signal, stops the lowering of the piston 31. The measuring instrument 23 starts the testing of the device to be tested 12 by supplying the test voltage to the test terminals 24 and in response to the received detection signal. Also, a configuration may be adopted whereby, when the piston 31 has descended to a pre-confirmed position at which it is possible to ensure a specified atmospheric pressure, the lowering of the piston 31 is stopped, and the testing is started.

In this way, the testing of the device to be tested 12 is carried out in a condition in which the atmospheric pressure of the internal space 34 of the pressure vessel 33, which is the testing environment, is raised.

Step S308: when the testing is finished, the evacuation solenoid valve 20 is opened, the internal space 34 of the pressure vessel 33 is returned to a normal pressure, and the piston 31 is raised by the servo motor 32 being returned to the original position.

Although it is possible to return the internal space 34 to a normal pressure even when the piston 31 is raised with the evacuation solenoid valve 20 in a closed condition, the lowering of the bottom plate 11 in the next step S309 can be more smoothly carried out when the evacuation solenoid valve 20 is opened.

Step S309: the bottom plate 11 is lowered, and the device to be tested 12 is removed from the internal space 34. A process of categorizing the removed device to be tested 12 as good or defective, or the like, is carried out in accordance with the testing result.

Step S310: the next device to be tested 12 is mounted on the mounting stand 30, and the process is advanced to step S303.

The testing of the device to be tested 12 is carried out in accordance with the heretofore described steps. When the removal of atmospheric components in the internal space 34 is necessary, or when it is necessary to increase the concentration of the gas supplied, the pipe 16 is connected to a vacuum pump, and the vacuum pump is activated between step S303 and step S304, discharging air remaining in the internal space 34.

Also, when the humidity of the internal space 34 of the pressure vessel 33 is high, it may happen that the dielectric strength of the testing environment decreases due to an adsorption of moisture by the device to be tested 12 or test electrodes 26 and 27, or the moisture contained in the environmental gas itself. For this reason, in order not to reduce the dielectric strength, it is effective to keep the humidity of the internal space 34 at 80% RH or less.

In the way heretofore described, in the second embodiment, the test voltage is supplied from the test electrodes 26 and 27 to the device to be tested 12, and the testing of the device to be tested 12 is carried out in a condition in which the atmospheric pressure of the internal space 34 of the pressure vessel 33, which is the testing environment, is raised. According to this configuration, in the same way as in the first embodiment, it is possible to reduce the possibility of dielectric breakdown occurring in the environment of the internal space 34 during testing, and discharge occurring between the electrodes 28 and 29 of the device to be tested 12, between the electrodes 28 and 29 and the testing device 2, or the like.

For this reason, as it is possible to perform the high voltage testing without using a gas with a high insulation property in the gas supplied to the internal space 34 of the pressure vessel 33, it is possible to reduce the burden on the global environment.

Also, as it is possible to perform the high voltage testing without using a gas with a high insulation property, it is possible to considerably reduce the testing cost.

Furthermore, as it is possible to increase the dielectric strength of the environment of the internal space 34 simply by raising the atmospheric pressure of the internal space 34, it is possible to realize the high voltage testing without complicating the testing device or the equipment for the testing.

Next, a description will be given, as a third embodiment, of one example of a dielectric strength test to which the testing methods of the first and second embodiments are applied.

Third Embodiment

Figure 7A:
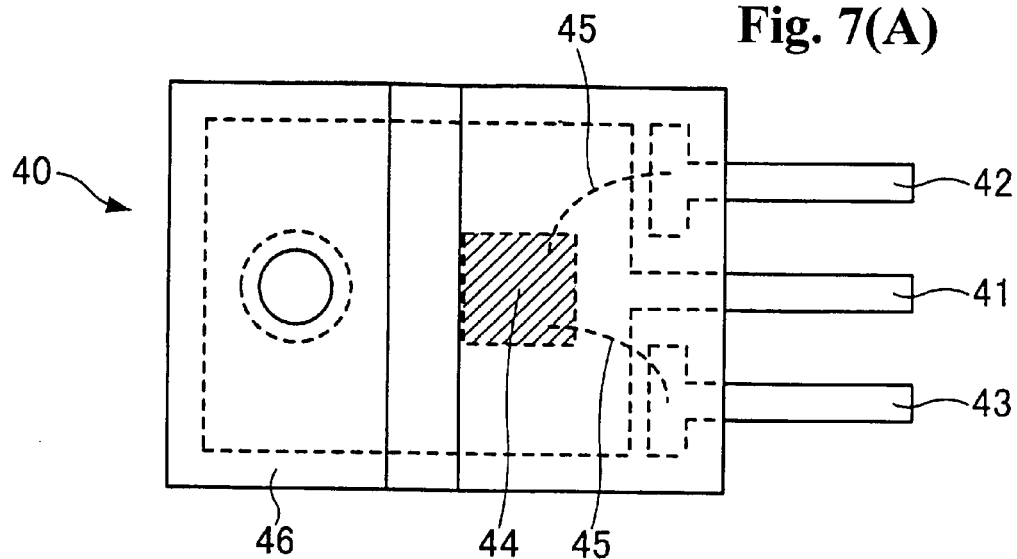
FIGS. 7A and 7B are diagrams showing one example of a dielectric strength test according to a third embodiment.
Figure 7B:
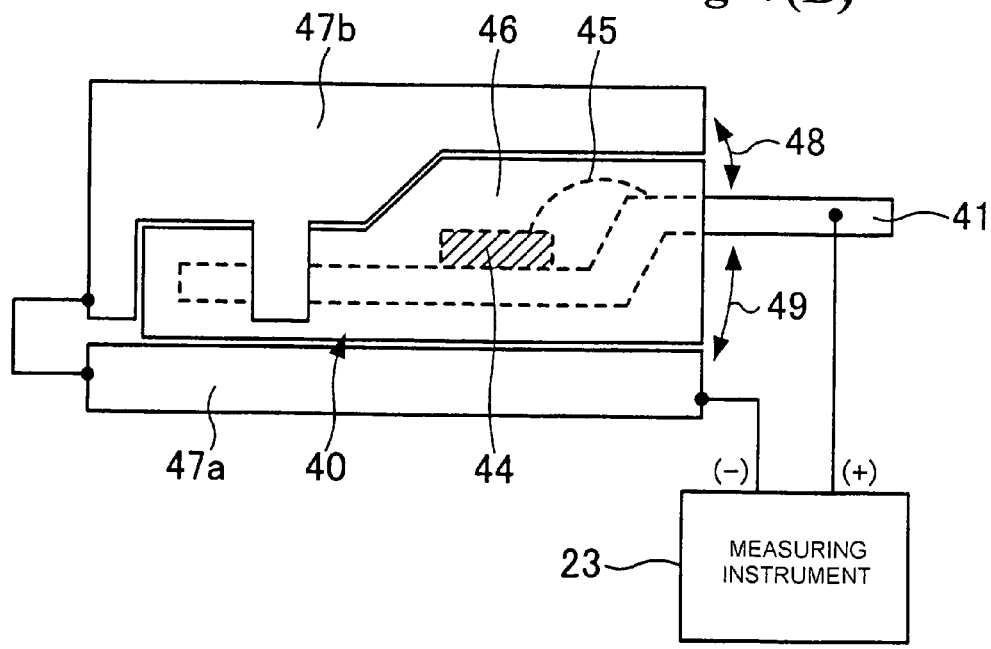

FIGS. 7A and 7B are diagrams showing one example of a dielectric strength test according to the third embodiment. FIG. 7A is a top view of a device 40 to be tested, and FIG. 7B is a sectional view of the device 40 to be tested to which test electrodes 47a and 47b are attached.

As shown in FIG. 7A, the device 40 to be tested has a frame electrode 41, a plurality of lead terminals 42 and 43, and a semiconductor chip 44. The semiconductor chip 44 is formed on the frame electrode 41, and the semiconductor chip 44 and lead terminals 42 and 43 are electrically connected by internal wires 45. Furthermore, the frame electrode 41, a plurality of lead terminals 42 and 43, semiconductor chip 44, and internal wires 45 are sealed with a resin 46. Herein, an end portion of the frame electrode 41, and an end portion of each of the lead terminals 42 and 43, is exposed from the resin 46.

When carrying out testing, the device 40 to be tested is sandwiched by the test electrodes 47a and 47b, as shown in FIG. 7B. Furthermore, the test electrodes 47a and 47b are short circuited, and the frame electrode 41 and lead terminals 42 and 43 are short circuited. Then, the testing of the device 40 to be tested is carried out by, for example, supplying a positive voltage to the frame electrode 41, and a negative voltage to the test electrode 47a from the measuring instrument 23. Herein, the measuring instrument 23 has an AC or DC high voltage generator and an ammeter.

The test is a test for measuring the insulation performance (the presence or absence of leakage current or dielectric breakdown) of the frame electrode 41 and lead terminals 42 and 43, and the surface of the resin 46. Depending on the object, there is a method whereby a specified voltage is applied for a specified time, and acceptance or rejection is determined, and a method whereby the voltage is stepped up, and dielectric strength measured.

In the event that the dielectric strength of the testing environment is low when carrying out the testing, there is a possibility of dielectric breakdown and discharge occurring between the frame electrode 41 and lead terminals 42 and 43 exposed from the resin 46 and the test electrode 47a or test electrode 47b (refer to arrows 48 and 49 in the drawing).

According to the testing methods according to the first and second embodiments, as it is possible to raise the dielectric strength of the testing environment, it is also possible to carry out a dielectric strength testing of this kind of device to be tested 40 while suppressing the effect of the discharge.

Figure 8:
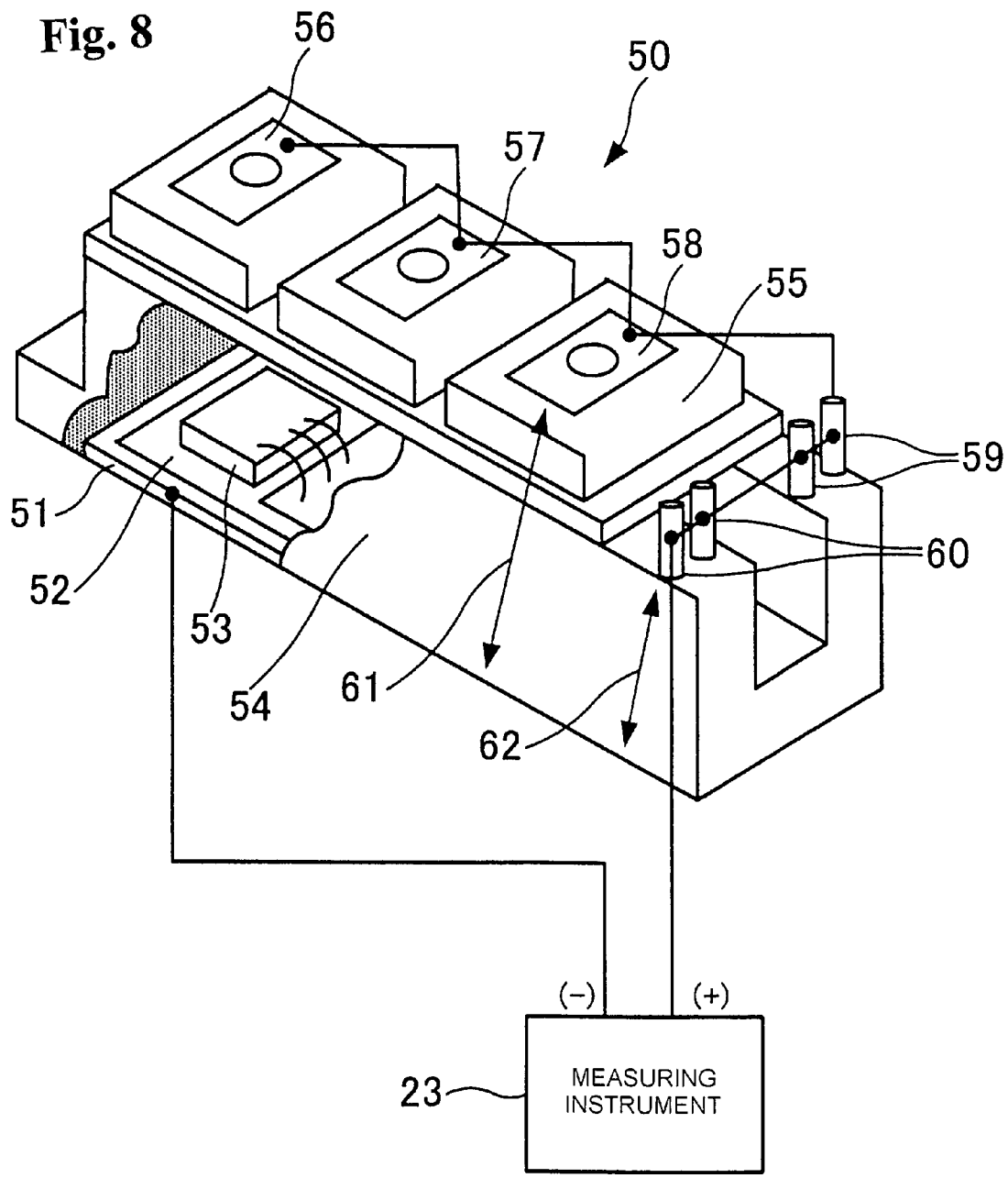
FIG. 8 is a perspective view of a diagram showing another example of a dielectric strength test according to the third embodiment.

Next, a description will be given of another example of a dielectric strength test. FIG. 8 is a diagram showing another example of a dielectric strength test according to the third embodiment.

A device 50 to be tested has a metal base 51, an insulation substrate 52 disposed on the metal base 51, an insulated gate bipolar transistor (IGBT) chip 53 disposed on the insulation substrate 52, and a resin case 54 housing the metal base 51, insulation substrate 52, and IGBT chip 53. Furthermore, a resin cover 55 is disposed on the resin case 54, and main terminals 56, 57, and 58 are disposed on the resin cover 55.

Furthermore, auxiliary terminals 59 and 60 are disposed on the resin case 54. The main terminals 56, 57, and 58 and auxiliary terminals 59 and 60 are electrically connected to the IGBT chip 53 by unshown internal wires.

When carrying out testing, all of the main terminals 56, 57, and 58 and auxiliary terminals 59 and 60 are short circuited. Then, the testing of the device 50 to be tested is carried out by, for example, supplying a positive voltage to the auxiliary terminal 60, and a negative voltage to the metal base 51 from the measuring instrument 23. Herein, the measuring instrument 23 has an AC or DC high voltage generator and an ammeter.

The test is a test for measuring the insulation performance of the metal base 51, and the IGBT chip 53, main terminals 56, 57, and 58, and auxiliary terminals 59 and 60. Depending on the object, there is a method whereby a specified voltage is applied for a specified time, and acceptance or rejection determined, and a method whereby the voltage is stepped up, and dielectric strength measured.

In the event that the dielectric strength of the testing environment is low when carrying out the testing, there is a possibility of dielectric breakdown and discharge occurring between the main terminals 56, 57, and 58 and metal base 51 (refer to arrow 61 in the drawing), or between the auxiliary terminals 59 and 60 and metal base 51 (refer to arrow 62 in the drawing).

According to the testing methods according to the first and second embodiments, as it is possible to raise the dielectric strength of the testing environment, it is also possible to carry out a dielectric strength testing of this kind of device to be tested 50 while suppressing the effect of the discharge.

Next, a description will be given, as a fourth embodiment, of examples of test circuits applied to the testing methods according to the first and second embodiments.

Fourth Embodiment

The test circuits described hereafter are provided in the measuring instrument 23 of the testing devices 1 and 2 in the first and second embodiments.

Figure 9A:
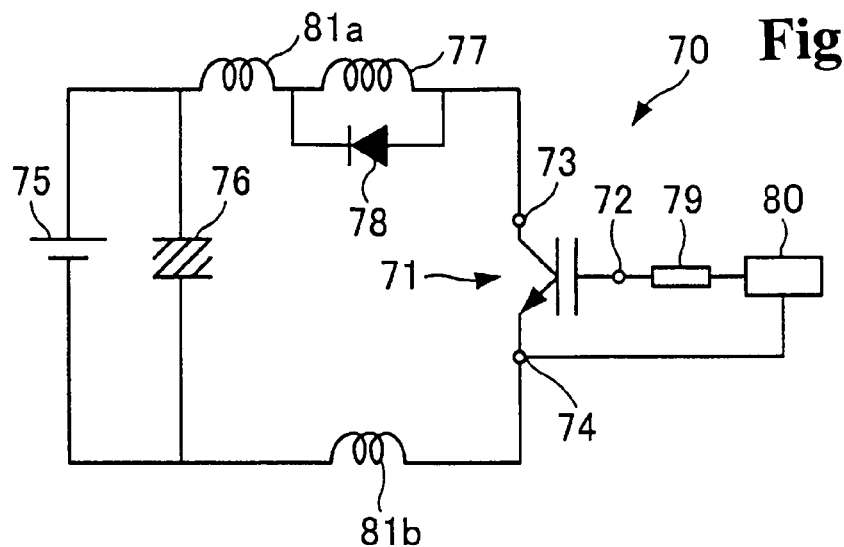
FIGS. 9A and 9B are diagrams showing one example of a test circuit according to a fourth embodiment, and a timing chart thereof.
Figure 9B:
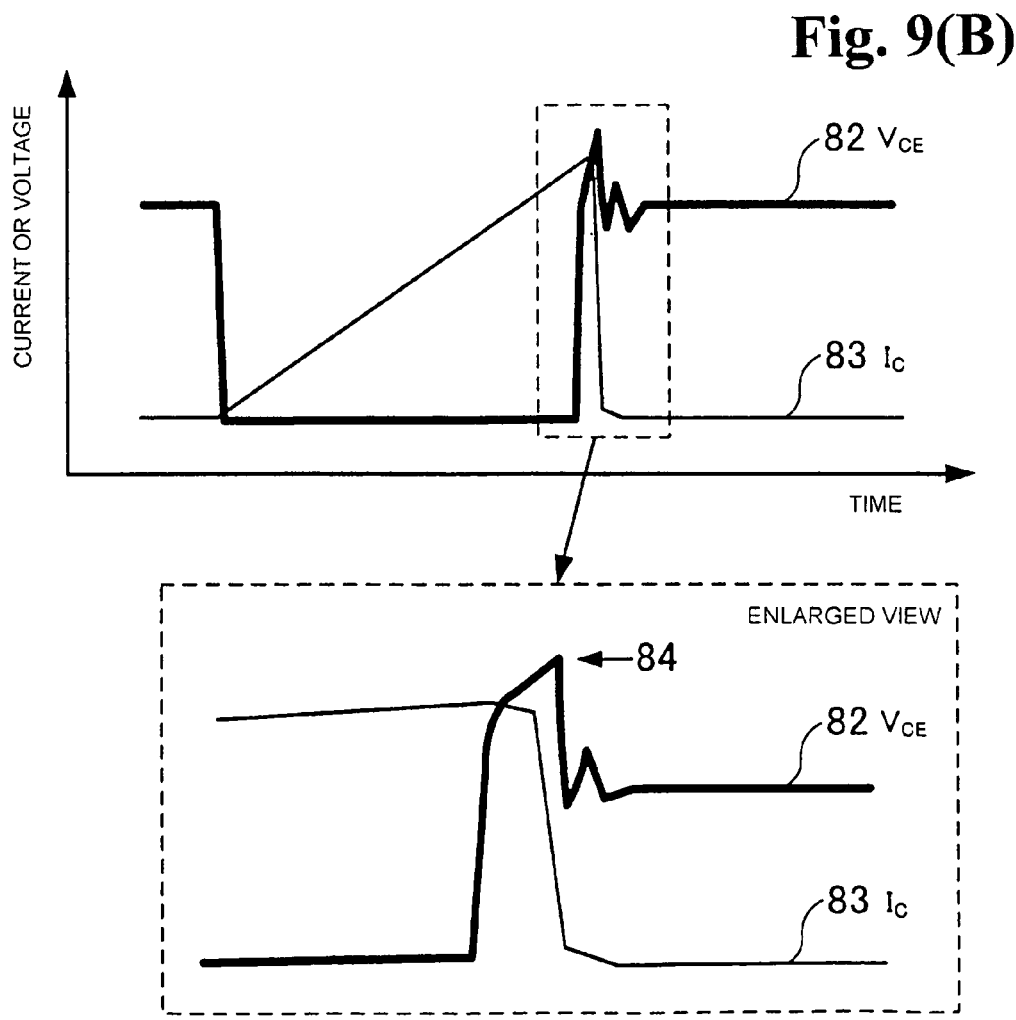

Firstly, a description will be given of a test circuit in a reverse bias safe operation area (RBSOA). FIGS. 9A and 9B are diagrams showing one example of a test circuit according to the fourth embodiment, and a timing chart thereof.

Herein, a transistor including a gate electrode, a collector electrode, and an emitter electrode is employed as a device 71 to be tested. As shown in FIG. 9A, an RBSOA test circuit 70 has a terminal 72 that connects to the gate electrode of the device 71 to be tested, a terminal 73 that connects to the collector electrode, and a terminal 74 that connects to the emitter electrode. Furthermore, the RBSOA test circuit 70 has a test power source 75, a capacitor 76, a load coil 77, a free wheeling diode (FWD) 78, a gate resistor 79, and a gate driver 80.

The load coil 77 and FWD 78 are electrically connected between the terminal 73 and the positive electrode of the test power source 75. The terminal 74 is electrically connected to the negative electrode of the test power source 75. Floating inductors 81a and 81b exist in the wires connecting the terminals 73 and 74 and the positive electrode and negative electrode of the test power source 75. The capacitor 76 is electrically connected between the positive electrode and negative electrode of the test power source 75. The gate resistor 79 and gate driver 80 are electrically connected between the terminal 72 and terminal 74.

FIG. 9B shows a timing chart of the RBSOA test circuit 70. A collector-emitter voltage ($V_{CE}$) 82 of the device 71 to be tested and a collector current ($I_C$) 83 are shown in the drawing. An arrow 84 in the enlarged view indicates a voltage jump owing to the floating inductors 81a and 81b of the circuit. The peak of the voltage jump is, for example, 1,700V.

Figure 10A:
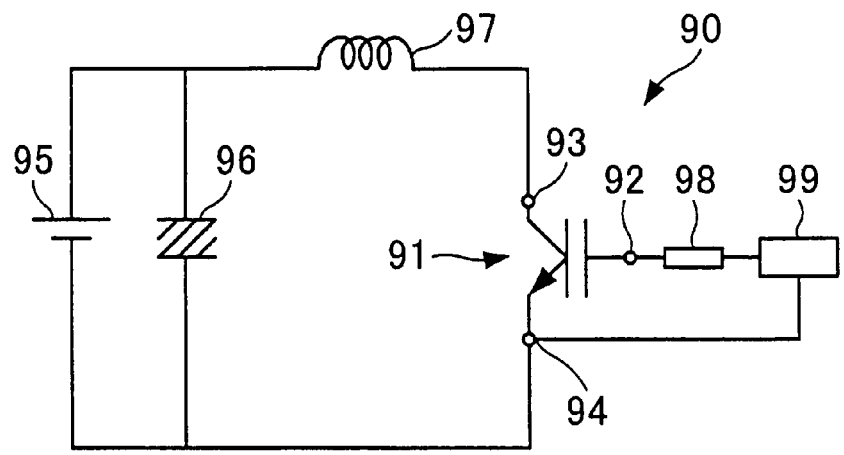
FIGS. 10A and 10B are diagrams showing another example of a test circuit according to the fourth embodiment, and a timing chart thereof.
Figure 10B:
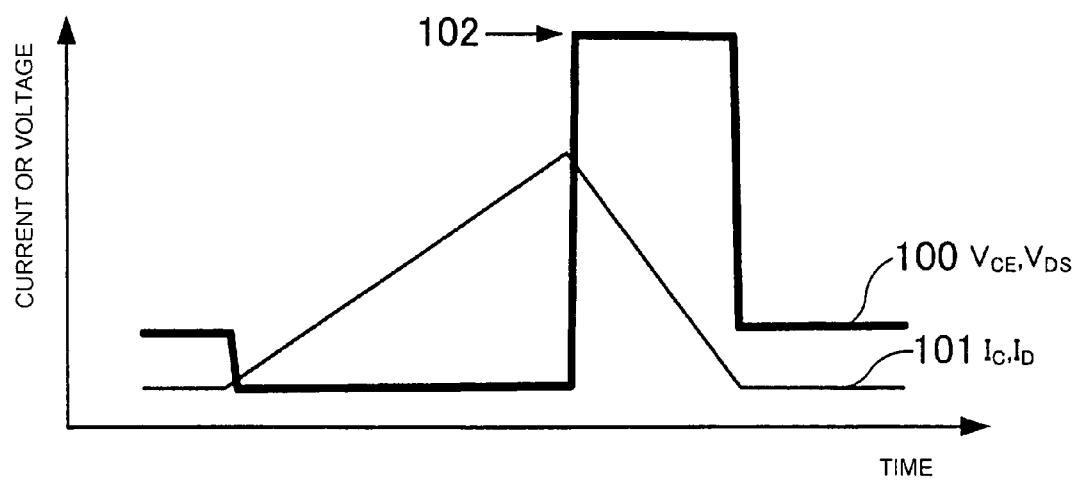

Next, a description will be given of an L load avalanche test circuit. FIGS. 10A and 10B are diagrams showing another example of a test circuit according to the fourth embodiment, and a timing chart thereof.

Herein, a transistor including a gate electrode, a collector electrode, and an emitter electrode, or a transistor including a gate electrode, a drain electrode, and a source electrode, is employed as a device to be tested 91.

As shown in FIG. 10A, an L load avalanche test circuit 90 has a terminal 92 that connects to the gate electrode of the device 91 to be tested, a terminal 93 that connects to the collector electrode or drain electrode, and a terminal 94 that connects to the emitter electrode or source electrode. Furthermore, the L load avalanche test circuit 90 has a test power source 95, a capacitor 96, a load coil 97, a gate resistor 98, and a gate driver 99.

The load coil 97 is electrically connected between the terminal 93 and the positive electrode of the test power source 95. The terminal 94 is electrically connected to the negative electrode of the test power source 95. The capacitor 96 is electrically connected between the positive electrode and negative electrode of the test power source 95. The gate resistor 98 and gate driver 99 are electrically connected between the terminal 92 and terminal 94.

FIG. 10B shows a timing chart of the L load avalanche test circuit 90. A collector-emitter voltage ($V_{CE}$) or drain-source voltage ($V_{DS}$) 100 of the device 91 to be tested, and a collector current ($I_C$) or drain current ($I_D$) 101, are shown in the drawing. At an arrow 102, a voltage jump owing to load inductance rises as far as the device resistance. The peak of the voltage jump is, for example, 1,000V.

Figure 11A:
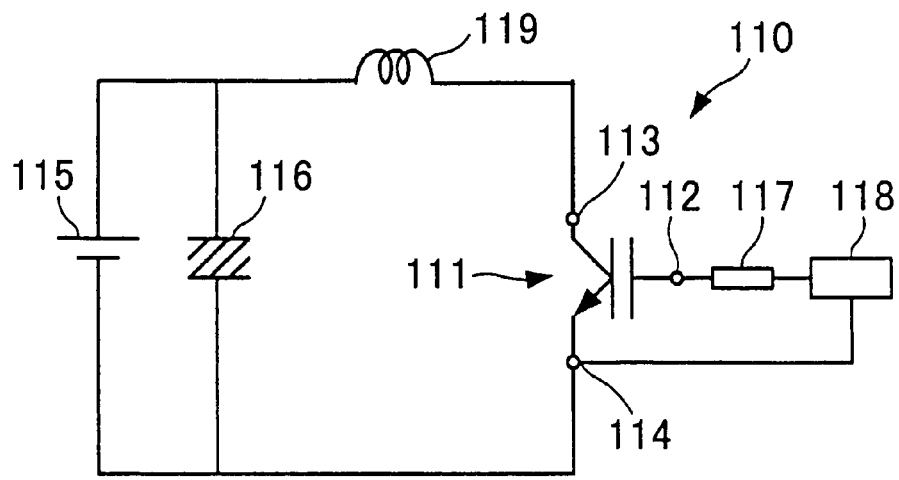
FIGS. 11A and 11B are diagrams showing another example of a test circuit according to the fourth embodiment, and a timing chart thereof.
Figure 11B:
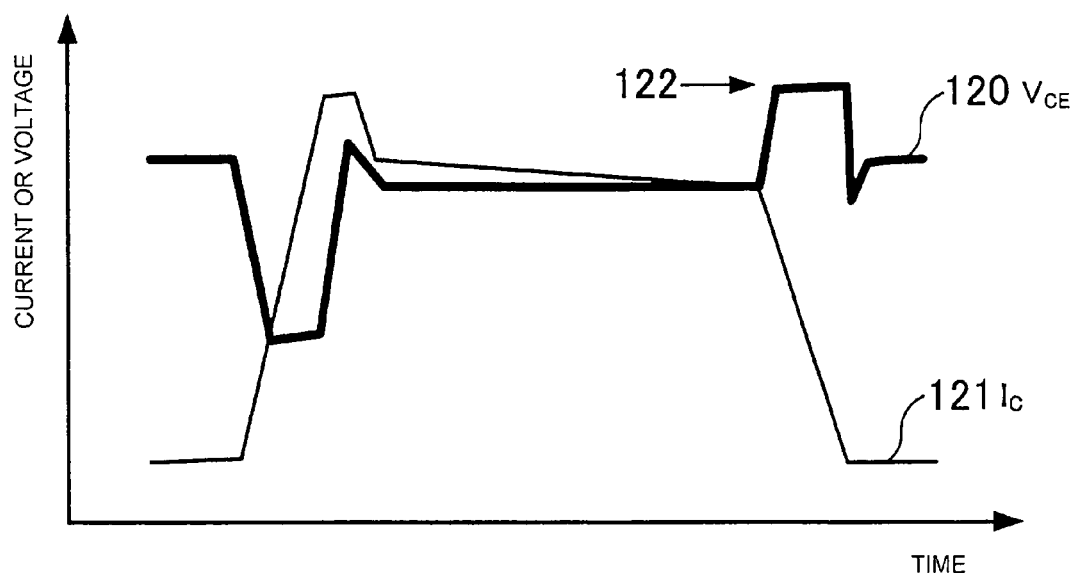

Next, a description will be given of a load short circuit test circuit. FIGS. 11A and 11B are diagrams showing still another example of a test circuit according to the fourth embodiment, and a timing chart thereof.

Herein, a transistor including a gate electrode, a collector electrode, and an emitter electrode is employed as a device to be tested 111. As shown in FIG. 11A, a load short circuit test circuit 110 has a terminal 112 that connects to the gate electrode of the device 111 to be tested, a terminal 113 that connects to the collector electrode, and a terminal 114 that connects to the emitter electrode. Furthermore, the load short circuit test circuit 110 has a test power source 115, a capacitor 116, a gate resistor 117, and a gate driver 118.

The terminal 113 is electrically connected to the positive electrode of the test power source 115. A floating inductor 119 exists in the wire connecting the terminal 113 and the positive electrode of the test power source 115. The terminal 114 is electrically connected to the negative electrode of the test power source 115. The capacitor 116 is electrically connected between the positive electrode and negative electrode of the test power source 115. The gate resistor 117 and gate driver 118 are electrically connected between the terminal 112 and terminal 114.

FIG. 11B shows a timing chart of the load short circuit test circuit 110. A collector-emitter voltage ($V_{CE}$) 120 of the device 111 to be tested and a collector current ($I_C$) 121 are shown in the drawing. An arrow 122 indicates a voltage jump owing to the floating inductor 119 of the circuit. The peak of the voltage jump is, for example, 1,700V.

Figure 12A:
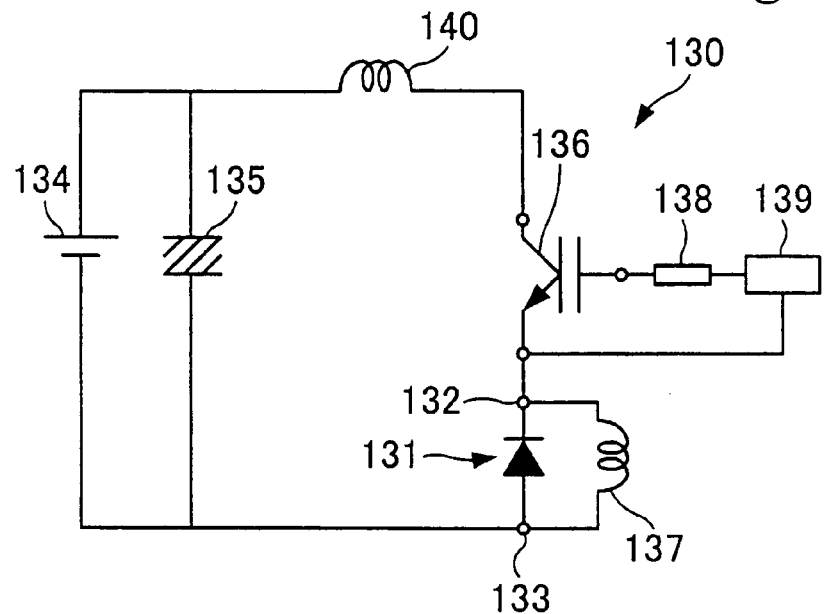
FIGS. 12A and 12B are diagrams showing another example of a test circuit according to the fourth embodiment, and a timing chart thereof.
Figure 12B:
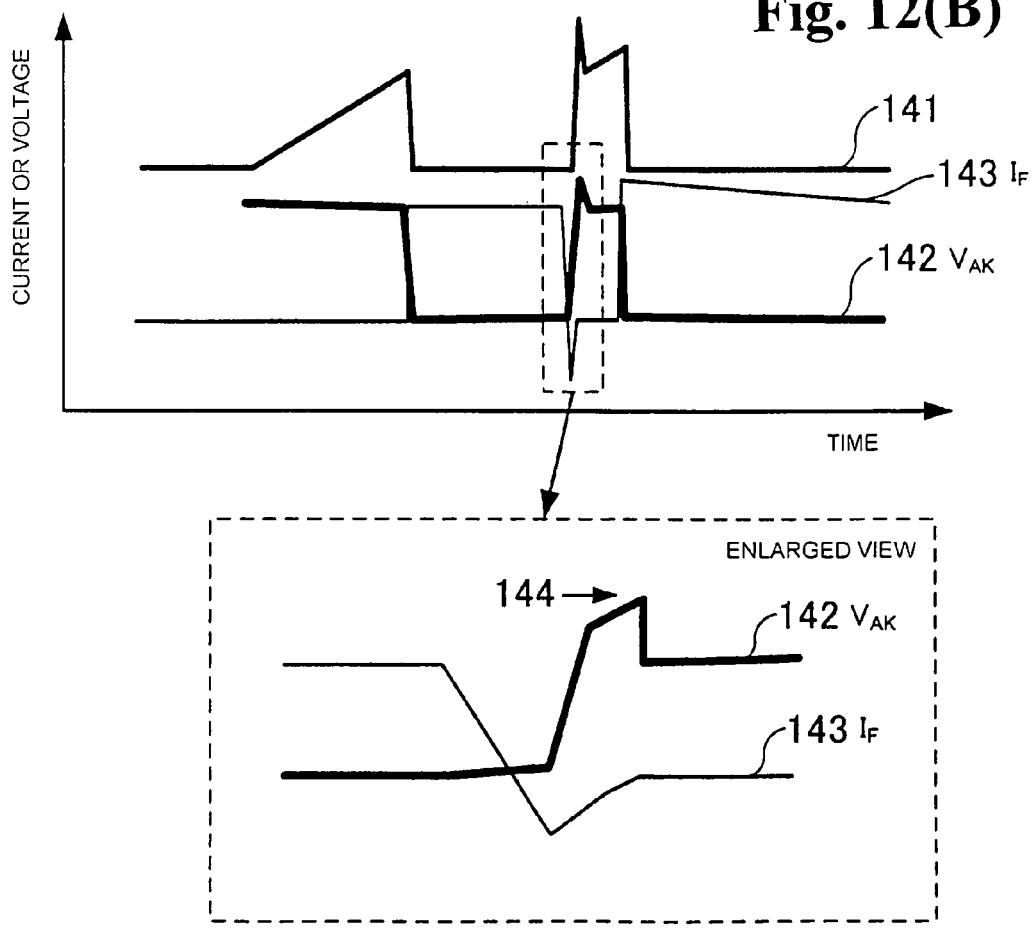

Next, a description will be given of a reverse recovery action assurance test circuit. FIGS. 12A and 12B are diagrams showing still another example of a test circuit according to the fourth embodiment, and a timing chart thereof.

Herein, a diode including a cathode and an anode is employed as a device 131 to be tested. As shown in FIG. 12A, a reverse recovery action assurance test circuit 130 has a terminal 132 that connects to the cathode of the device 131 to be tested, and a terminal 133 that connects to the anode. Furthermore, the reverse recovery action assurance test circuit 130 has a test power source 134, a capacitor 135, a switch element 136, a load coil 137, a gate resistor 138, and a gate driver 139.

The switch element 136 is electrically connected between the terminal 132 and the positive electrode of the test power source 134. A floating inductor 140 exists in the wire connecting the terminal 132 and the positive electrode of the test power source 134. The terminal 133 is electrically connected to the negative electrode of the test power source 134. The capacitor 135 is electrically connected between the positive electrode and negative electrode of the test power source 134.

The load coil 137 is electrically connected between the terminal 132 and terminal 133. The gate resistor 138 and gate driver 139 are electrically connected between a control electrode of the switch element 136 and the terminal 132.

FIG. 12B shows a timing chart of the reverse recovery action assurance test circuit 130. A collector current 141 of the switch element 136, and a cathode-anode voltage ($V_{AK}$) 142 and current ($I_F$) 143 of the device 131 to be tested are shown in the drawing. An arrow 144 in the enlarged view indicates a voltage jump. The peak of the voltage jump is, for example, 1,700V.

Figure 13A:
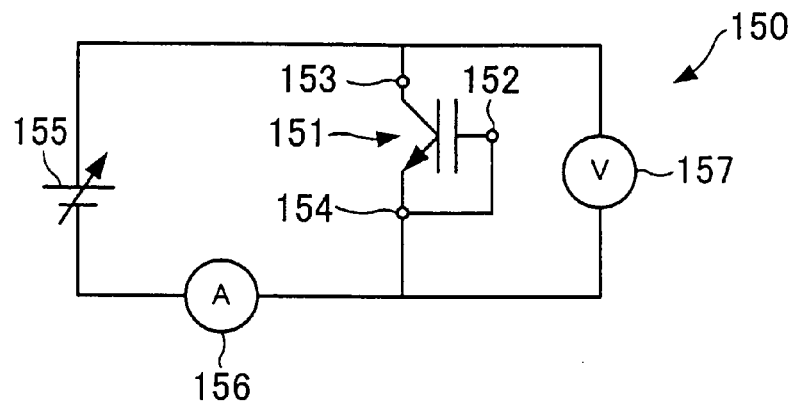
FIGS. 13A to 13C are diagrams showing another example of a test circuit according to the fourth embodiment, and a timing chart thereof.
Figure 13B:
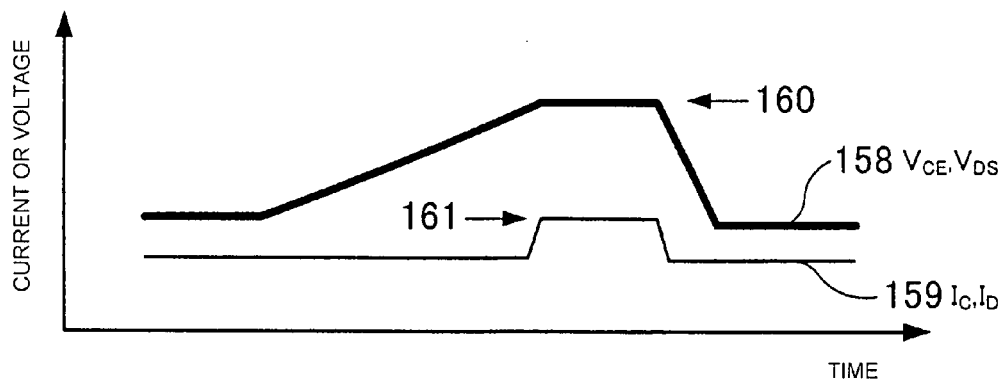
Figure 13C:
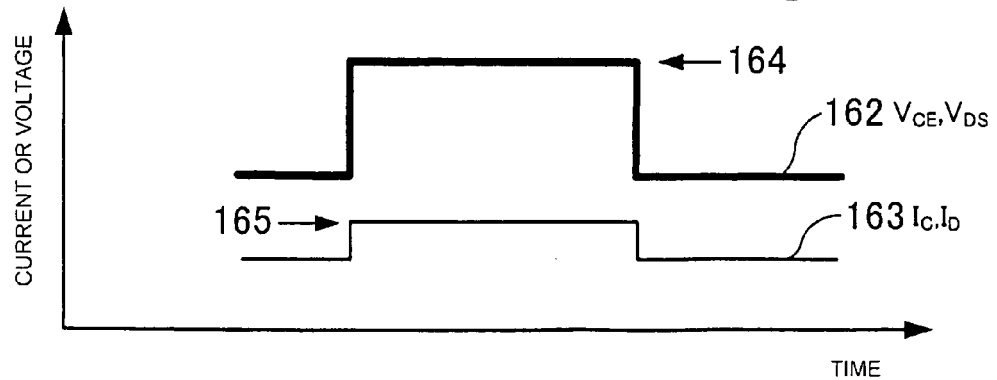

Next, a description will be given of a dielectric strength (withstand voltage) and leakage current measurement circuit. FIGS. 13A to 13C are diagrams showing still another example of a test circuit according to the fourth embodiment, and a timing chart thereof.

A transistor including a gate electrode, a collector electrode, and an emitter electrode, or a transistor including a gate electrode, a drain electrode, and a source electrode, is employed as a device to be tested 151.

As shown in FIG. 13A, a dielectric strength and leakage current measurement circuit 150 has a terminal 152 that connects to the gate electrode of the device 151 to be tested, a terminal 153 that connects to the collector electrode or drain electrode of the device 151 to be tested, and a terminal 154 that connects to the emitter electrode or source electrode of the device 151 to be tested. Furthermore, the dielectric strength and leakage current measurement circuit 150 has a test voltage variable power source 155, a current measurement circuit 156, and a voltage measurement circuit 157.

The terminal 153 is electrically connected to the positive electrode of the test voltage variable power source 155. The current measurement circuit 156 is electrically connected between the terminal 154 and the negative electrode of the test voltage variable power source 155. The voltage measurement circuit 157 is electrically connected between the terminal 153 and terminal 154. The terminal 152 and terminal 154 are electrically connected.

FIGS. 13B and 13C show timing charts of the dielectric strength and leakage current measurement circuit 150. FIG. 13B shows a timing chart for a dielectric strength measurement, and FIG. 13C shows a timing chart for a leakage current measurement.

A collector-emitter voltage ($V_{CE}$) or drain-source voltage ($V_{DS}$) 158 of the device 151 to be tested, and a collector current ($I_C$) or drain current ($I_D$) 159, are shown in FIG. 13B. An arrow 160 indicates a dielectric strength, which is the collector-emitter voltage ($V_{CE}$) or drain-source voltage ($V_{DS}$) when a specified current flows through the collector or drain, and an arrow 161 indicates the specified current value. The dielectric strength is, for example, 1,821V.

A collector-emitter voltage ($V_{CE}$) or drain-source voltage ($V_{DS}$) 162, and a collector current ($I_C$) or drain current ($I_D$) 163, are shown in FIG. 13C. An arrow 164 indicates a specified voltage value, and an arrow 165 indicates the leakage current when the specified voltage is applied. The specified voltage value is normally a rated voltage, and is, for example, 1,700V.

Next, a description will be given, as a fifth embodiment, of examples of devices under test to which the testing methods according to the first and second embodiments are applied.

Fifth Embodiment

Figure 14A:
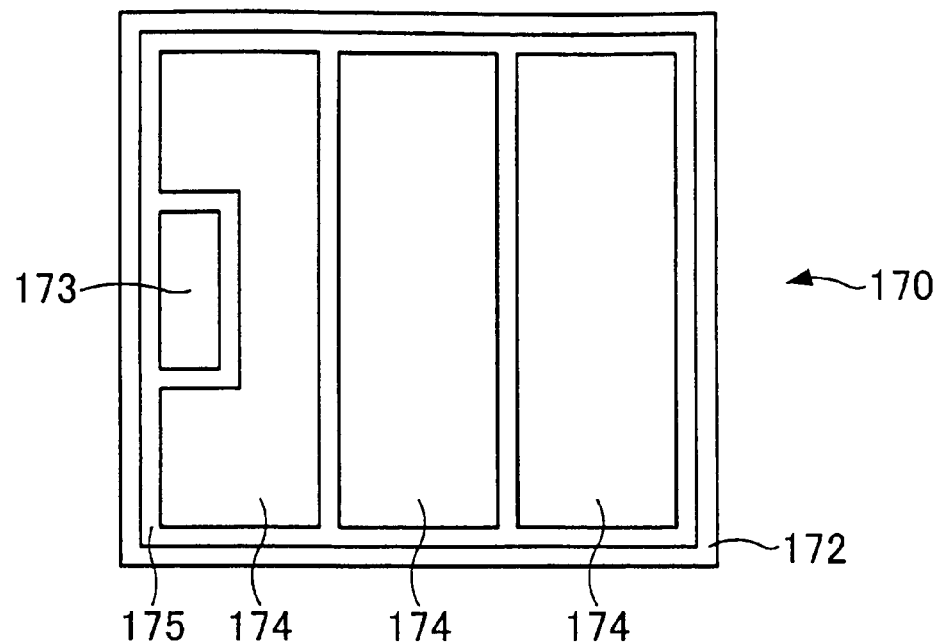
FIGS. 14A and 14B are diagrams showing one example of a device to be tested according to a fifth embodiment.
Figure 14B:
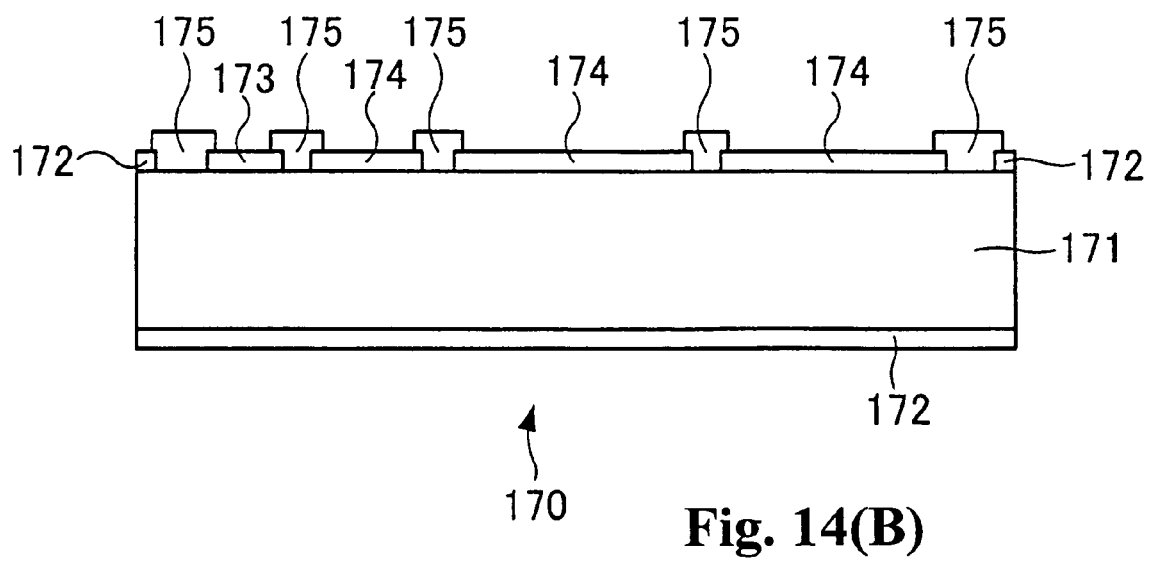

FIGS. 14A and 14B are diagrams showing one example of a device to be tested according to the fifth embodiment. FIG. 14A is a top view of a device 170 to be tested, and FIG. 14B is a sectional view of the device 170 to be tested.

The device 170 to be tested is a semiconductor chip. Herein, an IGBT chip is given as an example. As shown in FIGS. 14A and 14B, the device 170 to be tested has a silicon substrate 171, a collector electrode 172 formed on the upper surface and lower surface of the silicon substrate 171, and a gate electrode 173, emitter electrode 174, and insulating film 175 formed on the upper surface of the silicon substrate 171. The collector electrode 172, gate electrode 173, and emitter electrode 174 formed on the upper surface of the silicon substrate 171 are isolated from each other by the insulating film 175.

When a high voltage testing is performed on the device 170 to be tested, a specific high voltage is applied, for example, between the collector electrode 172 and emitter electrode 174, or between the collector electrode 172 and gate electrode 173. Because of this, there is a possibility of a discharge occurring between any pair of electrodes.

According to the testing methods according to the first and second embodiments, as it is possible to increase the dielectric strength of the testing environment, it is also possible to carry out a high voltage testing of this kind of device 170 to be tested while suppressing the effect of the discharge. A semiconductor wafer on which a plurality of semiconductor chips is formed may be used as the device to be tested.

Figure 15A:
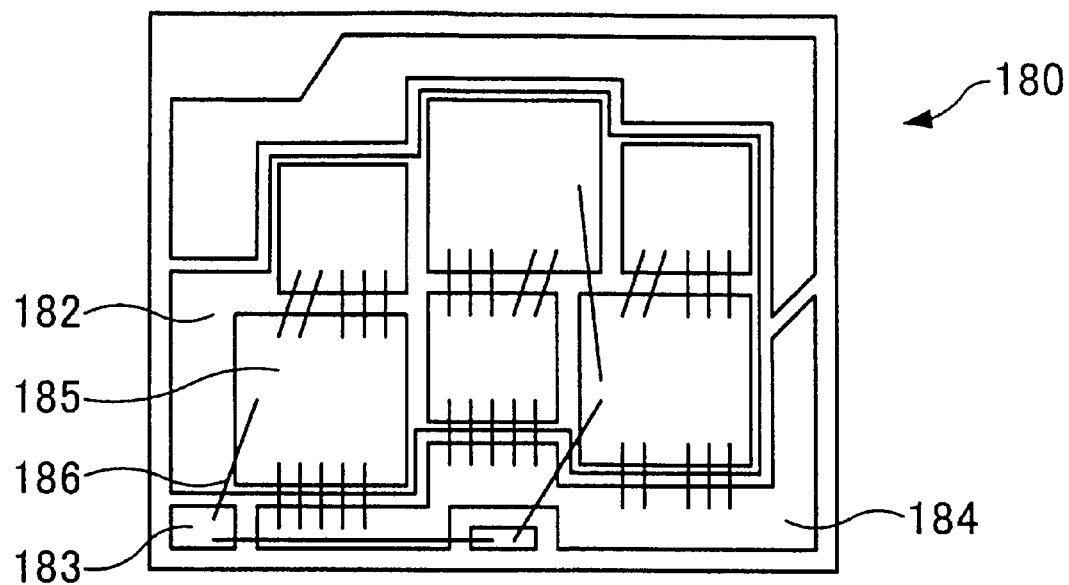
FIGS. 15A and 15B are diagrams showing another example of a device to be tested according to the fifth embodiment.
Figure 15B:
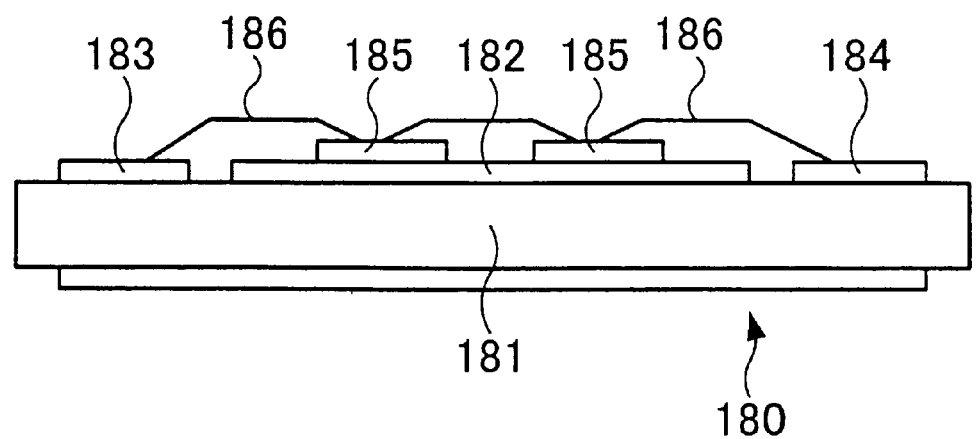

FIGS. 15A and 15B are diagrams showing another example of a device to be tested according to the fifth embodiment. FIG. 15A is a top view of a device 180 to be tested, and FIG. 15B is a sectional view of the device 180 to be tested.

The device 180 to be tested is a semi-finished semiconductor module. Herein, a semi-finished IGBT module is given as an example. As shown in FIGS. 15A and 15B, the device 180 to be tested has a ceramic substrate 181, and a collector electrode 182, gate electrode 183, and emitter electrode 184 formed on the upper surface of the ceramic substrate 181. An IGBT chip 185 is formed (mounted) above the collector electrode 182. The IGBT chip 185 and the gate electrode 183 and emitter electrode 184 are connected by wires 186.

When a high voltage testing is performed on the device 180 to be tested, a specific high voltage is applied, for example, between the collector electrode 182 and emitter electrode 184, or between the collector electrode 182 and gate electrode 183. Because of this, there is a possibility of a discharge occurring between any pair of electrodes, or between any electrode and the wire 186.

According to the testing methods of the first and second embodiments, as it is possible to increase the dielectric strength of the testing environment, it is also possible to carry out a high voltage testing of this kind of device to be tested 180 while suppressing the effect of the discharge.

Figure 16A:
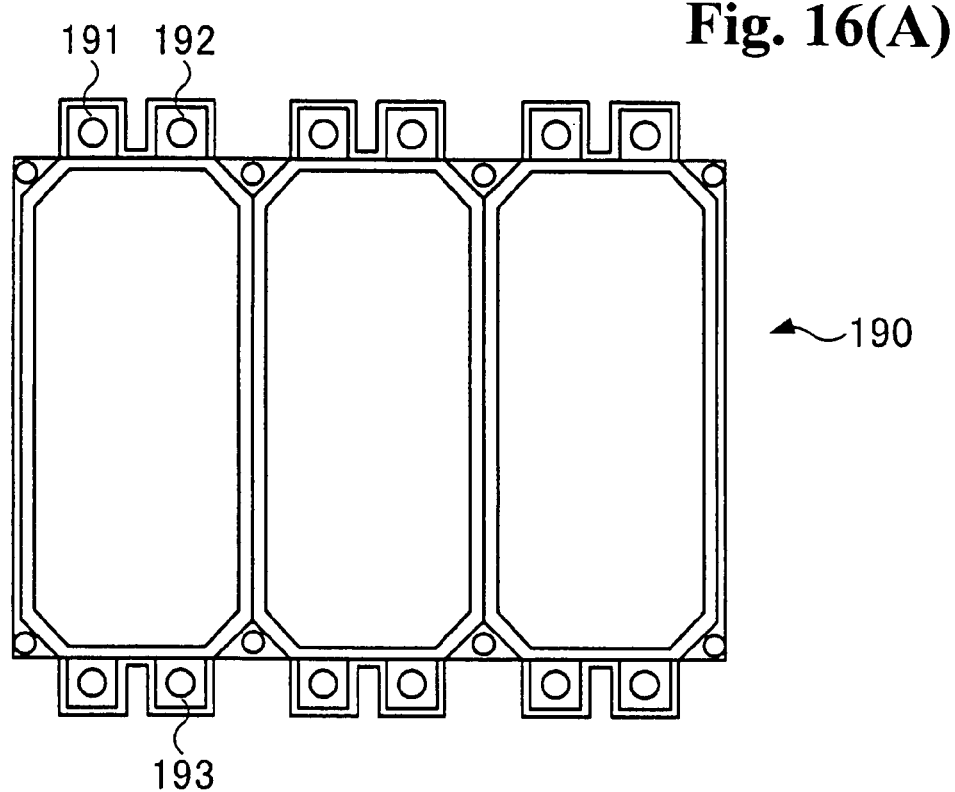
FIGS. 16A and 16B are diagrams showing another example of a device to be tested according to the fifth embodiment.
Figure 16B:
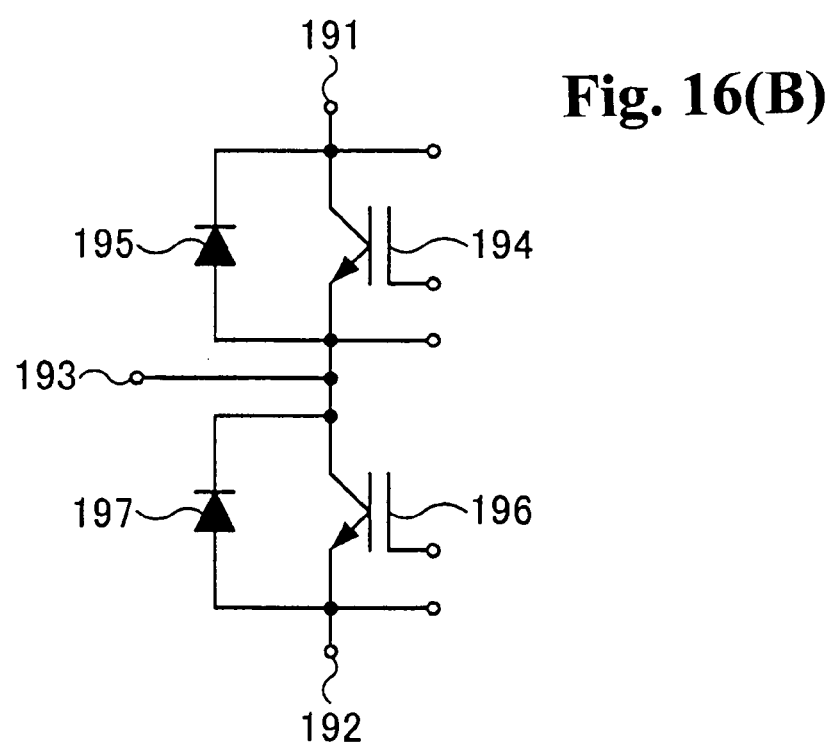

FIGS. 16A and 16B are diagrams showing still another example of a device to be tested according to the fifth embodiment. FIG. 16A is a top view of a device 190 to be tested, and FIG. 16B is a circuit diagram of the device 190 to be tested.

The device 190 to be tested is a semiconductor module. Herein, an IGBT module is given as an example. As shown in FIGS. 16A and 16B, the device to be tested 190 has a p-electrode 191, an n-electrode 192, and a u-electrode 193. As shown in FIG. 16B, an IGBT element 194 and a diode 195 are electrically connected between the p-electrode 191 and u-electrode 193, and an IGBT element 196 and a diode 197 are electrically connected between the u-electrode 193 and n-electrode 192.

When a high voltage testing is performed on the device 190 to be tested, a specific high voltage is applied, for example, between the p-electrode 191 and n-electrode 192. Also, depending on the structure, it may happen that a high voltage is applied between the p-electrode 191 and u-electrode 193, between the n-electrode 192 and u-electrode 193, or between the p-electrode 191, n-electrode 192, and u-electrode 193 and a rear surface metal base (not shown). Because of this, there is a possibility of a discharge occurring between any pair of electrodes. The semiconductor module which is the device 190 to be tested, and a semiconductor package (a device 200 to be tested) to be described hereafter, are designed in such a way that no discharge occurs at a rated voltage or below, and it is when a voltage above the rated voltage is applied that there is concern about a discharge.

According to the testing methods according to the first and second embodiments, as it is possible to increase the dielectric strength of the testing environment, it is also possible to carry out a high voltage testing of this kind of device to be tested 190 while suppressing the effect of the discharge.

FIG. 17 is a diagram showing still another example of a device to be tested according to the fifth embodiment.

The device 200 to be tested is a semiconductor package having an anode 201 and a cathode 202, sealed with a resin 203.

When a high voltage testing is performed on the device 200 to be tested, a specific high voltage is applied, for example, between the anode 201 and cathode 202. Because of this, there is a possibility of a discharge occurring between the electrodes.

A device 210 to be tested is a semiconductor package having a gate electrode 211, a drain electrode 212, and a source electrode 213, sealed with a resin 214.

When a high voltage testing is performed on the device 210 to be tested, a specific high voltage is applied, for example, between the drain electrode 212 and gate electrode 211, or between the drain electrode 212 and source electrode 213. Because of this, there is a possibility of a discharge occurring between any pair of electrodes.

According to the testing methods according to the first and second embodiments, as it is possible to increase the dielectric strength of the testing environment, it is also possible to carry out a high voltage testing of these kinds of devices 200, 210 to be tested while suppressing the effect of the discharge.

Next, a description will be given, as a sixth embodiment, of a method of regulating the atmospheric pressure of the testing environment in the testing devices 1 and 2 of the first and second embodiments.

Sixth Embodiment

Herein, although a description will be given of the testing device 1 as being representative, the same also applies to the testing device 2. Firstly, a measuring device is disposed in the internal space 13 of the pressure vessel 10 of the testing device 1. Herein, an example is given of a case of using a semi-finished IGBT module including the same structure as the device 180 to be tested shown in FIGS. 15A and 15B as in the measuring device. The distance between electrodes is taken to be 1.1 mm.

Next, the atmospheric pressure of the internal space 13 of the pressure vessel 10 is made 0.1 MPa, and in this condition, the test voltage is gradually raised, the voltage at which dielectric breakdown occurs is read off, and this is taken to be the dielectric strength. The gas supplied to the internal space 13 is nitrogen.

Figure 18:
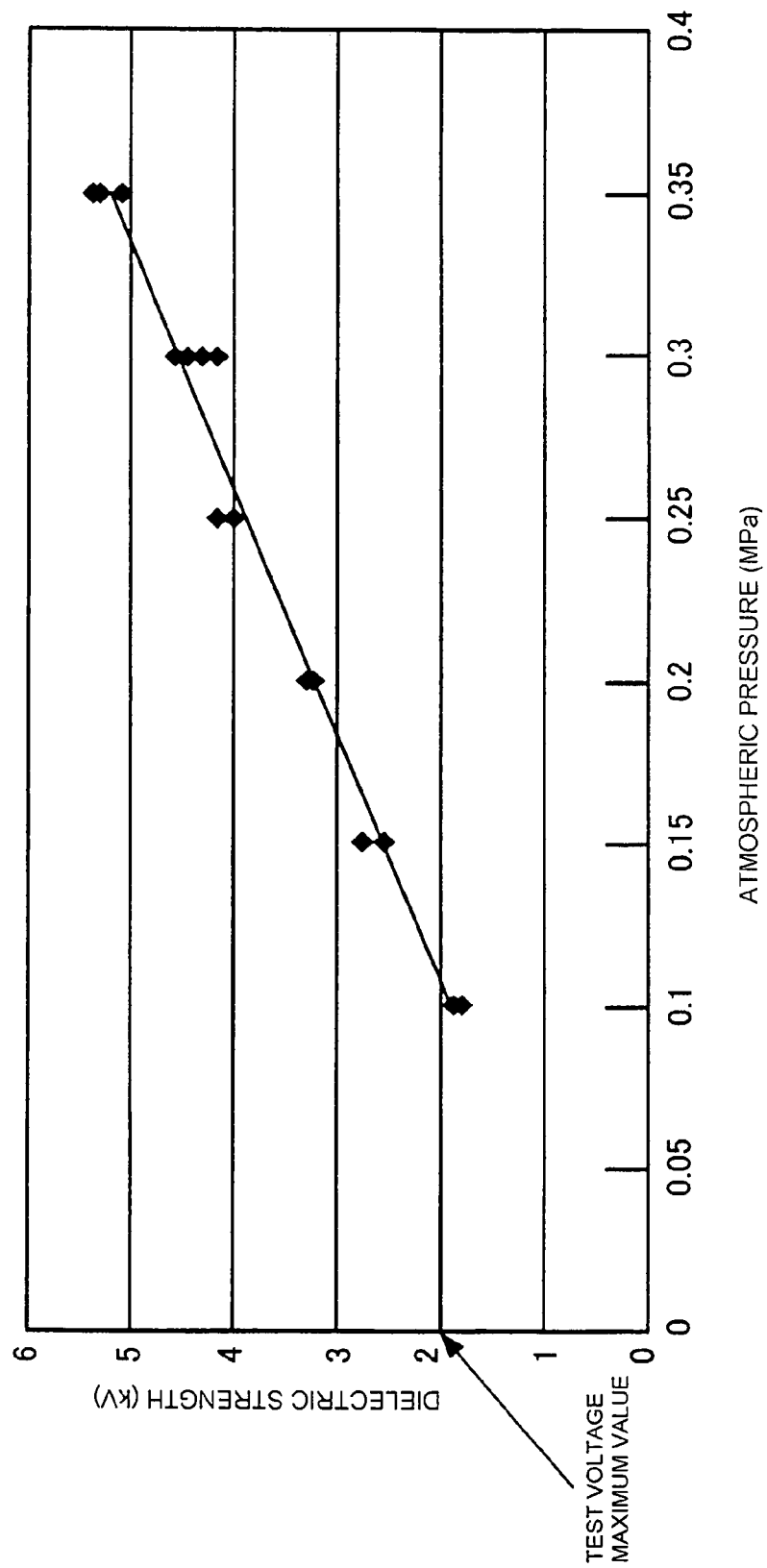
FIG. 18 is a graph showing one example of dielectric strength measurement results according to a sixth embodiment.

Next, the atmospheric pressure of the internal space 13 is made 0.15 MPa, and the dielectric strength is obtained in the same way. Hereafter, the atmospheric pressure is changed, and the dielectric strength is obtained in each case. FIG. 18 shows this plotted on a graph.

FIG. 18 is a diagram showing one example of dielectric strength measurement results according to the sixth embodiment. The horizontal axis of the graph of FIG. 18 shows the atmospheric pressure (MPa), and the vertical axis shows the dielectric strength (kV).

By referring to a graph compiled in this way, it is possible to read off an atmospheric pressure at which a high voltage testing can be safely carried out, and determine the atmospheric pressure conditions of the testing environment.

For example, when the maximum value of the test voltage is 2 kV, it is possible to perform testing while suppressing discharge by making the atmospheric pressure of the testing environment 0.15 MPa or more.

In order to increase dielectric strength, for example, there is a method whereby the atmospheric pressure of the internal space 13 of the pressure vessel 10 is raised, and a method whereby a gas with a high insulation performance, such as sulfur hexafluoride gas, is mixed into the gas supplied by the gas supplying source 17

The disclosure of Japanese Patent Application No. 2010-126680 filed on Jun. 2, 2010 is incorporated herein.

While the invention has been explained with reference to the specific embodiments of the invention, the explanation is illustrative and the invention is limited only by the appended claims.

What is claimed is:

1. A combination comprising:
   a device to be tested, comprising a semiconductor wafer, a semiconductor chip, a semiconductor package, a semiconductor module or a semi-finished semiconductor module; and
   a testing device comprising,
      a pressure vessel including an internal space therein;
      a mounting stand disposed in the internal space of the pressure vessel, on which the device to be tested is mounted;
      test electrodes disposed in the internal space of the pressure vessel, and supplying a predetermined test voltage to the device to be tested mounted on the mounting stand; and
      a pressurization unit that raises a pressure of the internal space of the pressure vessel such that a voltage at a dielectric breakdown of the device to be tested becomes higher than a maximum value of the predetermined test voltage applied to the device to be tested,
   wherein the predetermined test voltage is supplied from the test electrodes to the device to be tested mounted on the mounting stand, and testing of the device to be tested is carried out in a condition in which the pressure of the internal space of the pressure vessel is raised by the pressurization unit.

2. A combination according to claim 1, wherein the pressurization unit has a regulator that supplies a high pressure gas, pressure of which is adjusted, to the internal space of the pressure vessel.

3. A combination according to claim 1, wherein the testing device further comprises a relief valve that controls the pressure of the internal space of the pressure vessel.

4. A combination according to claim 1, wherein the pressurization unit has a piston that compresses a gas in the internal space of the pressure vessel.

5. A combination according to claim 1, wherein a gas supplied to the internal space of the pressure vessel is any one of nitrogen, compressed air, oxygen, carbon dioxide, or argon, or a mixed gas thereof 6. A combination according to claim 1, wherein the testing device further comprises a solenoid valve that controls an inflow and outflow of gas in the internal space of the pressure vessel.

7. A combination according to claim 1, wherein the testing device further comprises an adjustment device for adjusting a humidity of the internal space of the pressure vessel to be a relative humidity of 80% or less when testing.

8. A combination according to claim 1, wherein the testing device further comprises a pressure gauge that measures the pressure of the internal space of the pressure vessel, and a measuring instrument that supplies the predetermined test voltage to the test electrodes; and when the pressure of the internal space reaches a predetermined value, the pressure gauge transmits a signal for start-testing to the measuring instrument that supplies the predetermined test voltage to the test electrodes.

9. A combination according to claim 1, wherein the testing device further comprises a test terminal, a bottom plate, 0-rings and a measuring instrument;
   the device to be tested further comprises an electrode;
   the pressure vessel includes an aperture at a top portion thereof and an internal wall, and the pressurization unit has a piston movably disposed in the aperture to compress a gas in the internal space of the pressure vessel and a servo motor connecting to the piston to control the piston;
   the test terminal extends into the internal space though the internal wall and contacts the test electrode in the internal space, and the electrode of the device to be tested contacts the test electrode of the testing device to receive the predetermined test voltage; and
   the bottom plate is movably disposed under the pressure vessel and supports the mounting stand, the O-rings are arranged between the bottom plate and the pressure vessel to seal the internal space, and the measuring instrument is electrically connected to the test electrode though the test terminal to supply the predetermined test voltage to the device to be tested.

10. A testing method, comprising steps of:
   preparing a semiconductor wafer, a semiconductor chip, a semiconductor package, a semiconductor module or a semi-finished semiconductor module as a device to be tested;
   mounting the device to be tested on a mounting stand disposed in an internal space in a pressure vessel;
   raising a pressure of the internal space in the pressure vessel such that a voltage at a dielectric breakdown of the device to be tasted becomes higher than a maximum value of the predetermined test voltage applied to the device to be tested; and
   supplying the predetermined test voltage from test electrodes disposed in the internal space to the device to be tested mounted on the mounting stand and carrying out testing of the device to be tested, in a condition in which the pressure of the internal space in the pressure vessel is raised.

11. A testing method according to claim 10, further comprising a step of supplying any one of nitrogen, compressed air, oxygen, carbon dioxide, or argon, or a mixed gas thereof, to the internal space in the pressure vessel.

12. A testing method according to claim 10, further comprising, before a step of raising the pressure of the internal space inside the pressure vessel, a step of measuring the voltage at the dielectric breakdown of the device to be tasted with respect to each pressure of the internal space in the pressure vessel, and a step of obtaining a relation between the pressure of the internal space and the voltage at the dielectric breakdown of the device to be tasted.

13. A testing method according to claim 10, further comprising a step of adjusting a humidity of the internal space in the pressure vessel at a relative humidity of 80% or less before raising the pressure of the internal space in the pressure vessel.

\* \* \* \* \*

UNITED STATES PATENT AND TRADEMARK OFFICE
CERTIFICATE OF CORRECTION

PATENT NO. : 8,610,446 B2  Page 1 of 1
APPLICATION NO. : 13/067421
DATED : December 17, 2013
INVENTOR(S) : Atsushi Yoshida et al.

It is certified that error appears in the above-identified patent and that said Letters Patent is hereby corrected as shown below:

In the Specification

Change column 1, line 40, "away as to" to --a way as to--.

Change column 6, line 57, "inmost cases" to --in most cases--.

Change column 7, line 67, "a servomotor 32" to --a servo motor 32--.

Change column 8, line 6, 65, and 66, "servomotor" to --servo motor--.

Change column 9, line 2 and Column 10, line 7, "24 and" to --24 and 25--.

Signed and Sealed this
Twenty-fifth Day of March, 2014

Michelle K. Lee
*Deputy Director of the United States Patent and Trademark Office*